US012035583B2

(12) United States Patent
Cho et al.

(10) Patent No.: US 12,035,583 B2
(45) Date of Patent: Jul. 9, 2024

(54) DISPLAY DEVICE INCLUDING CONDUCTIVE LAYER OVERLAPPING WITH PAD PORTION

(71) Applicant: Samsung Display Co., Ltd., Yongin-si (KR)

(72) Inventors: Seunghwan Cho, Yongin-si (KR); Jonghyun Choi, Yongin-si (KR); Taehyun Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 724 days.

(21) Appl. No.: 17/259,523

(22) PCT Filed: Apr. 18, 2019

(86) PCT No.: PCT/KR2019/004690
§ 371 (c)(1),
(2) Date: Jan. 11, 2021

(87) PCT Pub. No.: WO2020/013427
PCT Pub. Date: Jan. 16, 2020

(65) Prior Publication Data
US 2021/0305351 A1    Sep. 30, 2021

(30) Foreign Application Priority Data
Jul. 11, 2018  (KR) .................. 10-2018-0080656

(51) Int. Cl.
*H10K 59/131*    (2023.01)
(52) U.S. Cl.
CPC .................. *H10K 59/131* (2023.02)
(58) Field of Classification Search
CPC ..................... H10K 59/131; H10K 50/80
See application file for complete search history.

(56) References Cited

U.S. PATENT DOCUMENTS 7,477,337 B2    1/2009  Murade
8,749,262 B2    6/2014  Jung et al.
(Continued)

FOREIGN PATENT DOCUMENTS

CN    107300793 A   * 10/2017   ......... G02F 1/13306
JP    2015-191211 A    11/2015
(Continued)

OTHER PUBLICATIONS

International Search Report of corresponding Application No. PCT/KR2019/004690, dated Jul. 19, 2019, with English translation, 5 pages.

(Continued)

*Primary Examiner* — Lex H Malsawma
*Assistant Examiner* — Bruce R. Smith
(74) *Attorney, Agent, or Firm* — Lewis Roca Rothgerber Christie LLP

(57) ABSTRACT

A display device includes: a substrate including a display area, and a peripheral area around the display area; a pad portion at the peripheral area, and including a first pad and a second pad adjacent to each other; a fan-out wire portion including a first fan-out wire below the first pad and connected to the first pad through a first contact hole to extend to the display area, and a second fan-out wire below the second pad and connected to the second pad through a second contact hole to extend to the display area; and a conductive layer between an upper portion of the fan-out wire portion and a lower portion of the pad portion, and at least partially corresponding to an overlapping area of the fan-out wire portion and the pad portion. The second fan-out wire at least partially overlaps with the first pad.

20 Claims, 13 Drawing Sheets

(56) References Cited

U.S. PATENT DOCUMENTS

| | | |
|---|---|---|
| 8,975,761 B2 | 3/2015 | Jung |
| 9,412,803 B2 | 8/2016 | Park |
| 9,591,745 B2 | 3/2017 | Kim et al. |
| 10,275,063 B2 | 4/2019 | Aoki et al. |
| 10,606,397 B2 | 3/2020 | Jun |
| 2007/0045626 A1* | 3/2007 | Murade ............... G02F 1/13458 257/E27.131 |
| 2010/0025690 A1 | 2/2010 | Kim et al. |
| 2010/0244021 A1 | 9/2010 | Uochi et al. |
| 2011/0199569 A1* | 8/2011 | Matsui ................... H05K 1/117 257/770 |
| 2016/0204184 A1* | 7/2016 | Park ....................... H10K 59/88 257/774 |

FOREIGN PATENT DOCUMENTS

| | | |
|---|---|---|
| JP | 2017-215927 A | 12/2017 |
| KR | 10-0810475 B1 | 3/2008 |
| KR | 10-2010-0108215 A | 10/2010 |
| KR | 10-2014-0053626 A | 5/2014 |
| KR | 10-1482196 B1 | 1/2015 |
| KR | 10-2015-0087706 A | 7/2015 |
| KR | 10-2016-0043212 A | 4/2016 |
| KR | 10-1616910 B1 | 4/2016 |
| KR | 10-2016-0087978 A | 7/2016 |
| KR | 10-2017-0023239 A | 3/2017 |
| KR | 10-1783953 B1 | 10/2017 |

OTHER PUBLICATIONS

Korean Notice Of Allowance dated Aug. 17, 2023, issued in corresponding Korean Patent Application No. 10-2018-0080656 (2 pages).

* cited by examiner

DISPLAY DEVICE INCLUDING CONDUCTIVE LAYER OVERLAPPING WITH PAD PORTION

CROSS-REFERENCE TO RELATED APPLICATIONS

This application is a U.S. National Phase Patent Application of International Application Number PCT/KR2019/004690, filed on Apr. 18, 2019, which claims priority to Korean Patent Application Number 10-2018-0080656, filed on Jul. 11, 2018, the entire content of each of which is incorporated by reference herein.

BACKGROUND

1. Field

Aspects of example embodiments of the present disclosure relate to a display device, and more particularly, to a display device including a fan-out wire overlapping with a pad portion.

2. Description of the Related Art

Display devices visually display data. A display device includes a substrate divided into a display area, and a peripheral area outside the display area. In the display area, a scan line and a data line are insulated from each other, and a plurality of pixels connected to the scan line and the data line are arranged. Further, in the display area, a thin film transistor and a pixel electrode electrically connected to the thin film transistor are provided to correspond to each of the pixels. In addition, an opposite electrode is commonly provided in the pixels in the display area. In the peripheral area, various wires configured to transmit electrical signals to the display area, a scan driver, a data driver, a controller, and/or the like may be provided.

The use of such a display device has been diversified. Accordingly, research into measures to reduce or efficiently use the peripheral area of a display device has been actively conducted.

The above information disclosed in this Background section is for enhancement of understanding of the background of the present disclosure, and therefore, it may contain information that does not constitute prior art.

SUMMARY

One or more example embodiments of the present disclosure are directed to a display device in which a pad portion and a fan-out wire portion arranged at (e.g., in or on) a peripheral area of the display device overlap with each other. However, such aspects and features are provided as an example, and the present disclosure is not limited thereto.

According to one or more example embodiments of the present disclosure, a display device includes: a substrate including a display area at which an image is displayed by a pixel, and a peripheral area around the display area; a pad portion at the peripheral area, and including a first pad and a second pad adjacent to each other; a fan-out wire portion including a first fan-out wire below the first pad and connected to the first pad through a first contact hole to extend to the display area, and a second fan-out wire below the second pad and connected to the second pad through a second contact hole to extend to the display area; and a conductive layer between an upper portion of the fan-out wire portion and a lower portion of the pad portion, and at least partially corresponding to an overlapping area of the fan-out wire portion and the pad portion. The second fan-out wire at least partially overlaps with the first pad.

In an example embodiment, the conductive layer may be integrally provided to correspond to a portion of the first pad and a portion of the second pad.

In an example embodiment, the conductive layer may not overlap with the first contact hole and the second contact hole.

In an example embodiment, the conductive layer may be configured to be applied with a constant voltage.

In an example embodiment, the first pad may include a first end portion and a second end portion, the second end portion may be between the first end portion and the display area, and the first contact hole may be closer to the second end portion than the first end portion.

In an example embodiment, the conductive layer may correspond entirely to the pad portion, and may include an opening portion corresponding to the first contact hole and the second contact hole.

In an example embodiment, the first pad and the second pad may be arranged in a first direction, and at least a portion of the second fan-out wire may extend in a direction between the first direction and a second direction perpendicular to the first direction.

In an example embodiment, the first pad may have a rectangular shape in a plan view, and one side of the rectangular shape may be inclined with respect to the first direction.

In an example embodiment, the pad portion may include a first sub-pad portion including a plurality of pads extending in a first direction, and a second sub-pad portion including a plurality of pads extending in the first direction, and the first sub-pad portion and the second sub-pad portion may be arranged along a second direction crossing the first direction.

In an example embodiment, the conductive layer may include a first sub-conductive layer corresponding to the first sub-pad portion, and a second sub-conductive layer corresponding to the second sub-pad portion, and the first sub-conductive layer and the second sub-conductive layer may be spaced apart from each other.

In an example embodiment, a thin film transistor and a storage capacitor may be at the display area, the thin film transistor including a semiconductor layer, a gate electrode, a source electrode, and a drain electrode, and the storage capacitor including a first electrode and a second electrode, the conductive layer may be at the same layer as that of the source electrode, and the first fan-out wire may be at the same layer as that of the first electrode or the second electrode.

In an example embodiment, the first fan-out wire may be at the same layer as that of the first electrode, and the second fan-out wire may be at the same layer as that of the second electrode.

In an example embodiment, the thin film transistor may overlap with the storage capacitor.

In an example embodiment, the display device may further include: a sealing substrate for sealing the display area; and a sealing member for bonding the substrate to the sealing substrate at the peripheral area, and the conductive layer and the pad portion may at least partially overlap with the sealing member.

According to one or more example embodiments of the present disclosure, a display device includes: a substrate including a display area at which an image is displayed by a pixel, and a peripheral area around the display area; a pad portion at the peripheral area, and including a plurality of pads; a controller mounted on the pad portion; a fan-out wire portion including a plurality of fan-out wires connected to the plurality of pads to extend to the display area; and a conductive layer at least partially overlapping with the pad portion, and configured to be applied with a constant voltage.

In an example embodiment, an organic light-emitting diode may be at the display area, the organic light-emitting diode including a pixel electrode, an intermediate layer including an organic emission layer, and an opposite electrode, and the conductive layer may be configured to be applied with a voltage applied to the opposite electrode.

In an example embodiment, the pad portion and the fan-out wire portion may at least partially overlap with each other on different layers from each other, and the conductive layer may be between a lower portion of the pad portion and an upper portion of the fan-out wire portion.

In an example embodiment, the conductive layer may be integrally provided to correspond to a portion of each of the plurality of pads.

In an example embodiment, the plurality of pads of the pad portion may be connected to the plurality of fan-out wires of the fan-out wire portion through a plurality of contact holes, respectively, and the conductive layer may not overlap with the contact holes.

In an example embodiment, the pad portion may include a first pad and a second pad, the fan-out wire portion may include a first fan-out wire connected to the first pad, and a second fan-out wire connected to the second pad, and the first pad may at least partially overlap with the second fan-out wire.

As described above, in a display device according to one or more example embodiments of the present disclosure, a space of a peripheral area may be reduced by overlapping a pad portion and a fan-out wire portion. Further, a conductive layer may be arranged to correspond to an overlapping area of the pad portion and the fan-out wire portion, and thus, an interference phenomenon between the pad portion and the fan-out wire portion may be prevented or reduced, and defects due to compression bonding of a controller may be prevented or substantially prevented.

However, the present disclosure is not limited to such aspects and feature.

BRIEF DESCRIPTION OF THE DRAWINGS

The above and other aspects and features of the present disclosure will become more apparent to those skilled in the art from the following detailed description of the example embodiments with reference to the accompanying drawings.

DETAILED DESCRIPTION

Figure 1:
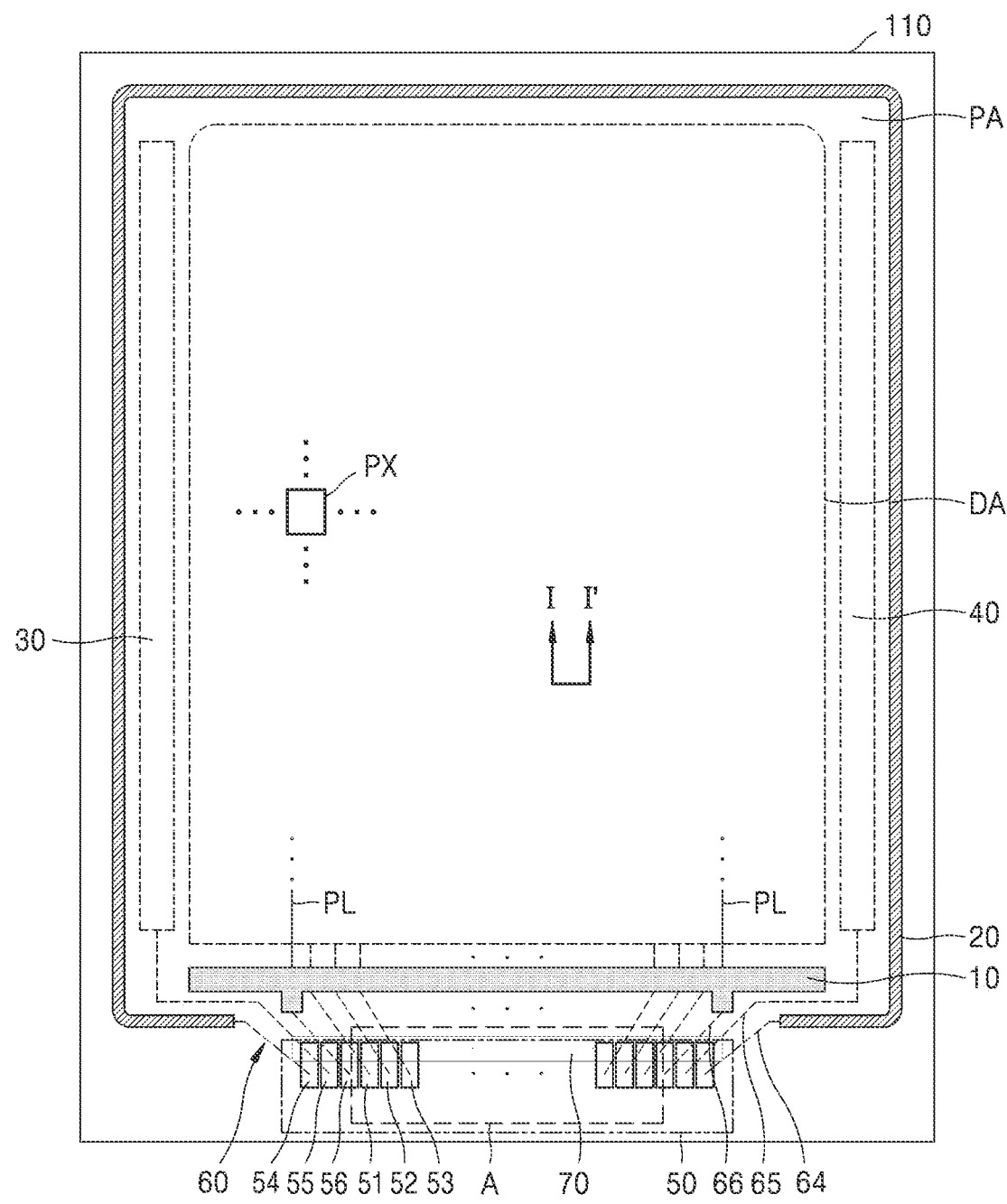
FIG. 1 is a schematic plan view of a display device according to an embodiment.

Hereinafter, example embodiments will be described in more detail with reference to the accompanying drawings, in which like reference numbers refer to like elements throughout. The present disclosure, however, may be embodied in various different forms, and should not be construed as being limited to only the illustrated embodiments herein. Rather, these embodiments are provided as examples so that this disclosure will be thorough and complete, and will fully convey the aspects and features of the present disclosure to those skilled in the art. Accordingly, processes, elements, and techniques that are not necessary to those having ordinary skill in the art for a complete understanding of the aspects and features of the present disclosure may not be described. Unless otherwise noted, like reference numerals denote like elements throughout the attached drawings and the written description, and thus, descriptions thereof may not be repeated.

In the drawings, the relative sizes of elements, layers, and regions may be exaggerated and/or simplified for clarity. Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

It will be understood that when an element or layer is referred to as being "on," "connected to," or "coupled to" another element or layer, it can be directly on, connected to, or coupled to the other element or layer, or one or more intervening elements or layers may be present. Similarly, when layers, regions, or components are referred to as being "electrically connected" to each other, they may be "directly electrically connected" to each other, and/or "indirectly electrically connected" to each other with one or more intervening layers, regions, or components therebetween. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present disclosure. As used herein, the singular forms "a" and "an" are intended to include the plural forms as well, unless the context clearly indicates otherwise. It will be further understood that the terms "comprises," "comprising," "includes," and "including," "has," "have," and "having," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present disclosure refers to "one or more embodiments of the present disclosure." As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

In brief overview, according to one or more example embodiments of the present disclosure, a display device may include a substrate including a display area at (e.g., in or on) which an image is displayed by a pixel, and a peripheral area surrounding (e.g., around a periphery of) the display area. A pad portion may be located at (e.g., in or on) the peripheral area, and may include a first pad and a second pad that are adjacent to each other. A fan-out wire portion including a first fan-out wire may be located below the first pad, and a second fan-out wire may be located below the second pad. The first fan-out wire may be connected to the first pad through a first contact hole to extend to the display area, and the second fan-out wire may be connected to the second pad through a second contact hole to extend to the display area. A conductive layer may be between an upper portion of the fan-out wire portion and a lower portion of the pad portion, and may at least partially correspond to an overlapping area of the fan-out wire portion and the pad portion. The second fan-out wire may at least partially overlap with the first pad.

A display device according to one or more example embodiments of the present disclosure may be a device that displays an image, and may be a liquid crystal display device, an electrophoretic display device, an organic light-emitting display device, an inorganic light-emitting display device, a field emission display device, a surface-conduction electron-emitter display device, a plasma display device, a cathode ray tube display device, or the like.

Hereinafter, for convenience, although an organic light-emitting display device is described in more detail below as an example of a display device according to an embodiment, the display device described herein is not limited thereto, and various suitable kinds of display devices may be used according to embodiments of the present disclosure.

FIG. 1 is a schematic plan view of a display device according to an embodiment.

Referring to FIG. 1, a substrate 110 of the display device is divided into a display area DA, and a peripheral area PA surrounding (e.g., around a periphery of) the display area DA. A plurality of pixels PX are included at (e.g., in or on) the display area DA to display an image. The plurality of pixels PX may be connected to a corresponding scan line, and a corresponding data line crossing the scan line. In addition, the plurality of pixels PX may be connected to a driving voltage line PL.

Each pixel PX may emit any suitable colored light, for example, red light, green light, blue light, or white light. As an example, each pixel PX may include an organic light-emitting diode. Also, each pixel PX may further include various suitable devices, for example, such as a thin film transistor and a storage capacitor. The display area DA provides a desired image (e.g., a certain or predetermined image) through light emitted from the pixels PX. In the present embodiment, the pixel PX may refer to a sub-pixel, and the sub-pixel may emit light of one of a red color, a green color, a blue color, and/or a white color as described above, but the present disclosure is not limited to these colors, and the sub-pixel may emit light of one of any suitable color.

The peripheral area PA is an area at (e.g., in or on) which the pixels PX are not arranged, and thus, may not provide an image. A first power voltage line 10 and a second power voltage line 20 configured to apply different power voltages from each other may be arranged at (e.g., in or on) the peripheral area PA. Further, a first scan driver 30, a second scan driver 40, and a pad portion 50 may be arranged at (e.g., in or on) the peripheral area PA.

The first power voltage line 10 may be arranged at (e.g., in or on) the peripheral area PA to correspond to a lower end portion of the display area DA. A plurality of driving voltage lines PL configured to transmit driving voltages to the plurality of pixels PX arranged at (e.g., in or on) the display area DA may be connected to the first power voltage line 10. The first power voltage line 10 may be connected to a pad 56 of the pad portion 50.

The second power voltage line 20 may be arranged at (e.g., in or on) the peripheral area PA to partially surround (e.g., around a periphery of) the display area DA. For example, in some embodiments, the second power voltage line 20 may extend along sides (e.g., three sides) of the display area DA at (e.g., in or on) the peripheral area PA, except for one side of the display area DA adjacent to the first power voltage line 10. However, the present disclosure is not limited thereto. The second power voltage line 20 may be variously modified, for example, to correspond to one or two sides of the display area DA. The second power voltage line 20 may be connected to a pad 54 of the pad portion 50.

The first scan driver 30 and the second scan driver 40 may be arranged at (e.g., in or on) the peripheral area PA with the display area DA therebetween. For example, the first scan driver 30 may correspond to a left side of the display area DA, and the second scan driver 40 may correspond to a right side of the display area DA. A scan signal generated by the first scan driver 30 may be provided to some of the pixels PX through a corresponding first scan line, and a scan signal generated by the second scan driver 40 may be provided to some of the pixels PX (e.g., others of the pixels PX) through a corresponding second scan line.

In some embodiments, the first scan driver 30 and the second scan driver 40 may be arranged on both sides (e.g., opposite sides) of the display area DA, and may perform dual scanning. For example, the first scan driver 30 may generate a scan signal and transmit the scan signal to some of the pixels PX from among the pixels PX included at (e.g., in or on) the display area DA, and the second scan driver 40 may generate a scan signal and transmit the scan signal to the other pixels PX from among the pixels PX included at (e.g., in or on) the display area DA. The first scan driver 30 and the second scan driver 40 may be synchronized by a synchronization-processed clock signal.

Although the scan drivers 30 and 40 are shown in FIG. 1 as being arranged on both sides (e.g., opposite sides) of the display area DA, the present disclosure is not limited thereto, and various modifications may be made, for example, such as the scan drivers 30 and 40 may be arranged at (e.g., in or on) the same side of the display area DA, or may not be arranged at (e.g., in or on) the peripheral area PA when the scan drivers 30 and 40 are arranged on a printed circuit board or the like.

The pad portion 50 is arranged at (e.g., in or on) the peripheral area PA, and includes a plurality of pads 51, 52, 53, 54, 55, and 56. The pad portion 50 may be exposed by not being covered by an insulating layer, and thus, may be electrically connected to a controller (e.g., a timing controller), for example, such as a flexible printed circuit board or a driving driver integrated circuit (IC) chip. The controller changes a plurality of image signals transmitted from the outside into a plurality of image data signals, and transmits the changed signals to the display area DA through the pad portion 50. Further, the controller may receive a vertical synchronization signal, a horizontal synchronization signal, and a clock signal, and may generate a control signal for controlling the driving of the first and second scan drivers 30 and 40, and thus, may transmit the control signal to each of the first and second scan drivers 30 and 40 through the pad 55 of the pad portion 50. The controller may transmit different voltages to the first power voltage line 10 and the second power voltage line 20, respectively, through the pad portion 50. The pad portion 50 may be connected to a fan-out wire portion 60 including a plurality of fan-out wires 61, 62, 63 (e.g., see FIG. 3), 64, 65, and 66 to transmit the voltages and the various signals to the display area DA.

The first power voltage line 10 may be configured to provide a first power voltage ELVDD to each pixel PX, and the second power voltage line 20 may be configured to provide a second power voltage ELVSS to each pixel PX. For example, the first power voltage ELVDD may be provided to each pixel PX through the driving voltage line PL connected to the first power voltage line 10. The second power voltage ELVSS may be connected to a cathode of an organic light-emitting diode included in each pixel PX from the peripheral area PA.

The fan-out wires 61, 62, 63, 64, 65, and 66 may be respectively connected to the pads 51, 52, 53, 54, 55, and 56 of the pad portion 50 to transmit electrical signals transmitted from the controller to the display area DA. In other words, the fan-out wires 61, 62, 63, 64, 65, and 66 may be connected to the pad portion 50, and may extended to the display area DA.

The fan-out wire portion 60, according to one or more example embodiments, may have a structure in which a fan-out wire connected to one pad overlaps with another pad, and a conductive layer 70 for preventing or substantially preventing a coupling effect due to the overlap is arranged below the pad portion 50.

The fan-out wire portion 60, the pad portion 50, and the conductive layer 70 according to one or more example embodiments will be described in more detail below.

Figure 2A:
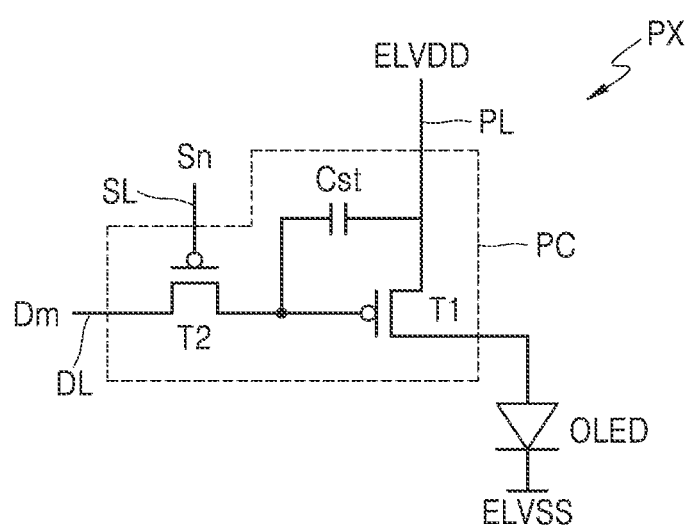
FIGS. 2A and 2B are equivalent circuit diagrams of a pixel of a display device according to one or more example embodiments.
Figure 2B:
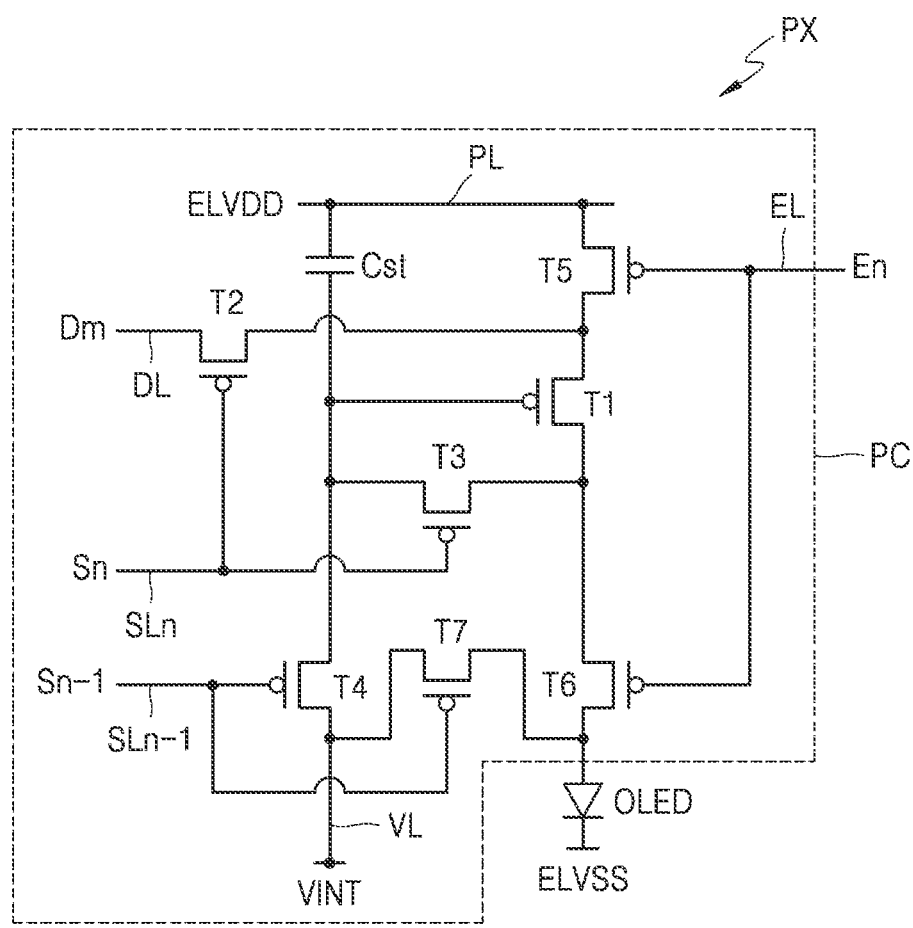

FIGS. 2A and 2B are equivalent circuit diagrams of a pixel of a display device according to one or more example embodiments.

Referring to FIG. 2A, each pixel PX includes a pixel circuit PC connected to a scan line SL and a data line DL, and an organic light-emitting diode OLED connected to the pixel circuit PC.

The pixel circuit PC includes a driving thin film transistor T1, a switching thin film transistor T2, and a storage capacitor Cst. The switching thin film transistor T2 is connected to the scan line SL and the data line DL, and is configured to transmit a data signal Dm input via the data line DL to the driving thin film transistor T1 according to a scan signal Sn input via the scan line SL.

The storage capacitor Cst is connected to the switching thin film transistor T2 and the driving voltage line PL, and stores a voltage corresponding to a difference between a voltage received from the switching thin film transistor T2 and the first power voltage ELVDD (e.g., a driving voltage) supplied to the driving voltage line PL.

The driving thin film transistor T1 may be connected to the driving voltage line PL and the storage capacitor Cst, and may control a driving current flowing through the organic light-emitting diode OLED from the driving voltage line PL in response to a voltage value stored in the storage capacitor Cst. The organic light-emitting diode OLED may emit light having a desired brightness (e.g., a predetermined brightness) according to the driving current.

Although a case in which the pixel circuit PC includes two thin film transistors and one storage capacitor has been described with reference to FIG. 2A, the present disclosure is not limited thereto.

Referring to FIG. 2B, the pixel circuit PC may include a driving thin film transistor T1, a switching thin film transistor T2, a compensation thin film transistor T3, a first initialization thin film transistor T4, a first emission control thin film transistor T5, a second emission control thin film transistor T6, and a second initialization thin film transistor T7.

Although FIG. 28 shows a case in which a plurality of signal lines SLn, SLn-1, EL, and DL, an initialization voltage line VL, and the driving voltage line PL are provided for each pixel PX, the present disclosure is not limited thereto. According to another embodiment, at least one of the signal lines SLn, SLn-1, EL, and DL and/or the initialization voltage line VL may be shared by neighboring pixels (e.g., by adjacent pixels).

A drain electrode of the driving thin film transistor T1 may be electrically connected to the organic light-emitting diode OLED via the second emission control thin film transistor T6. The driving thin film transistor T1 receives the data signal Dm according to a switching operation of the switching thin film transistor T2, and supplies a driving current to the organic light-emitting diode OLED.

A gate electrode of the switching thin film transistor T2 is connected to the scan line SLn, and a source electrode of the switching thin film transistor T2 is connected to the data line DL. A drain electrode of the switching thin film transistor T2 may be connected to a source electrode of the driving thin film transistor T1, and may also be connected to the driving voltage line PL via the first emission control thin film transistor T5.

The switching thin film transistor T2 is turned on according to the scan signal Sn received via the scan line SLn to perform a switching operation for transmitting the data signal Dm transmitted via the data line DL to the source electrode of the driving thin film transistor T1.

A gate electrode of the compensation thin film transistor T3 may be connected to the scan line SLn. A source electrode of the compensation thin film transistor T3 may be connected to the drain electrode of the driving thin film transistor T1, and may also be connected to a pixel electrode of the organic light-emitting diode OLED via the second emission control thin film transistor T6. A drain electrode of the compensation thin film transistor T3 may be connected to one electrode of the storage capacitor Cst, a source electrode of the first initialization thin film transistor T4, and a gate electrode of the driving thin film transistor T1. The compensation thin film transistor T3 is turned on according to the scan signal Sn received via the scan line SLn to diode-connect the driving thin film transistor T1 by connecting the gate electrode and the drain electrode of the driving thin film transistor T1 to each other.

A gate electrode of the first initialization thin film transistor T4 may be connected to the previous scan line SLn-1. A drain electrode of the first initialization thin film transistor T4 may be connected to the initialization voltage line VL. The source electrode of the first initialization thin film transistor T4 may be connected to one electrode of the storage capacitor Cst, the drain electrode of the compensation thin film transistor T3, and the gate electrode of the driving thin film transistor T1. The first initialization thin film transistor T4 may be turned on according to a previous scan signal Sn-1 received via the previous scan line SLn-1 to perform an initialization operation for initializing a voltage of the gate electrode of the driving thin film transistor T1 by transmitting an initialization voltage VINT to the gate electrode of the driving thin film transistor T1.

A gate electrode of the first emission control thin film transistor T5 may be connected to the emission control line EL. A source electrode of the first emission control thin film transistor T5 may be connected to the driving voltage line PL. A drain electrode of the first emission control thin film transistor T5 may be connected to the source electrode of the driving thin film transistor T1 and the drain electrode of the switching thin film transistor T2.

A gate electrode of the second emission control thin film transistor T6 may be connected to the emission control line EL. A source electrode of the second emission control thin film transistor T6 may be connected to the drain electrode of the driving thin film transistor T1 and the source electrode of the compensation thin film transistor T3. A drain electrode of the second emission control thin film transistor T6 may be electrically connected to the pixel electrode of the organic light-emitting diode OLED. As the first emission control thin film transistor T5 and the second emission control thin film transistor T6 are concurrently (e.g., simultaneously) turned on according to an emission control signal En received via the emission control line EL, the first power voltage ELVDD may be transmitted to the organic light-emitting diode OLED, and a driving current flows through the organic light-emitting diode OLED.

A gate electrode of the second initialization thin film transistor T7 may be connected to the previous scan line SLn-1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin film transistor T7 may be turned on according to the previous scan signal Sn-1 received via the previous scan line SLn-1 to initialize the pixel electrode of the organic light-emitting diode OLED.

Although FIG. 2B shows a case in which the first initialization thin film transistor T4 and the second initialization thin film transistor T7 are connected to the previous scan line SLn-1, the present disclosure is not limited thereto. According to another embodiment, the first initialization thin film transistor T4 may be connected to the previous scan line SLn-1, which may be a scan line of a previous row, to be driven according to the previous scan signal Sn-1, and the second initialization thin film transistor T7 may be connected to a separate signal line (for example, a subsequent scan line, which may be a scan line of a subsequent row) to be driven according to a signal transmitted to the corresponding separate signal line.

One electrode of the storage capacitor Cst may be connected to the gate electrode of the driving thin film transistor T1, the drain electrode of the compensation thin film transistor T3, and the source electrode of the first initialization thin film transistor T4. The other electrode of the storage capacitor Cst may be connected to the driving voltage line PL.

An opposite electrode (for example, a cathode) of the organic light-emitting diode OLED receives the second power voltage ELVSS (e.g., a common power voltage). The organic light-emitting diode OLED receives a driving current from the driving thin film transistor T1, and emits light according to the driving current.

However, the present disclosure is not limited to the structure and/or circuit design of the pixel PX shown in FIGS. 2A and 2B, and the pixel circuit PC is not limited to the number of thin film transistors and storage capacitors shown and described with reference to FIGS. 2A and 2B.

Hereinafter, a display device according to an embodiment will be described in more detail with reference to FIGS. 3 to 5.

Figure 3:
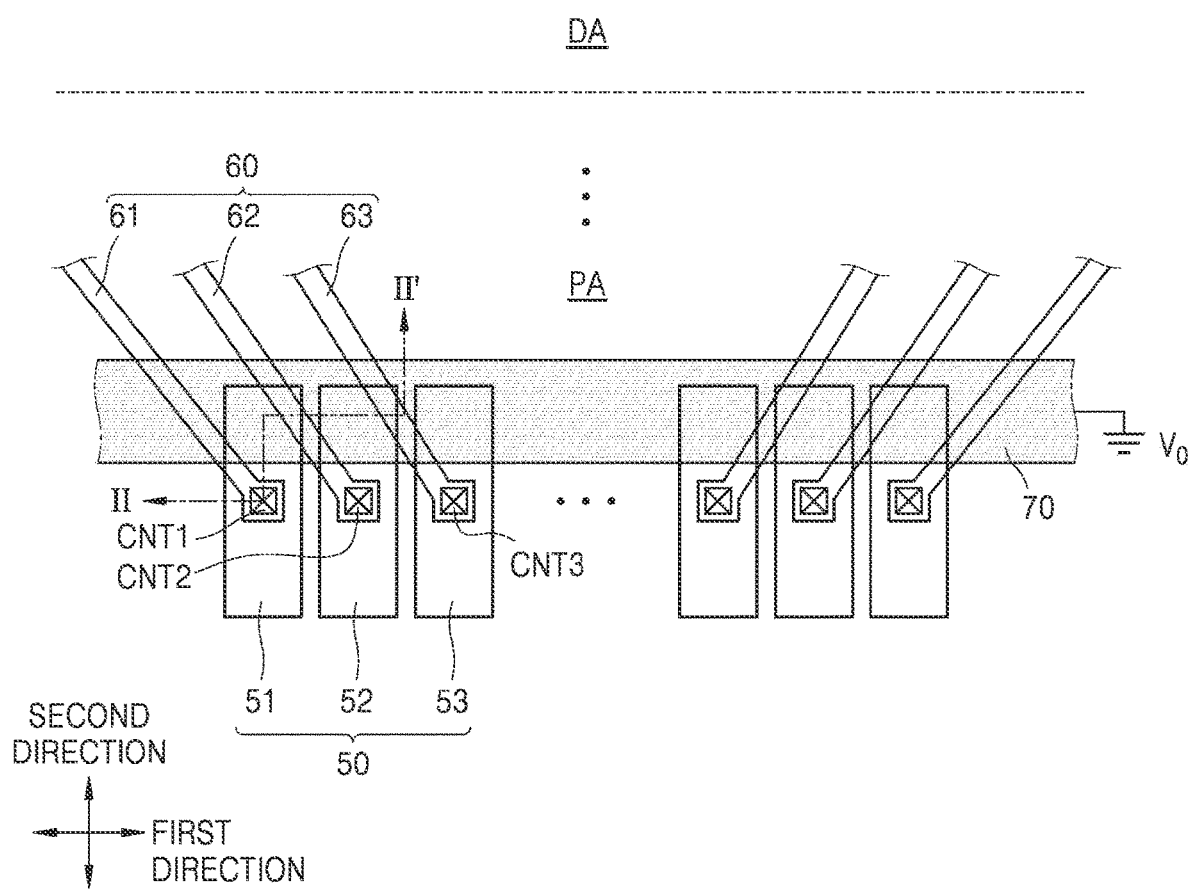
FIG. 3 is an enlarged diagram of the portion A of FIG. 1.

FIG. 3 is an interlayer layout diagram corresponding to the portion A of FIG. 1, and is a diagram partially illustrating a fan-out wire portion, a pad portion, and a conductive layer according to one or more embodiments. FIG. 4 shows a comparative example for comparison with one or more embodiments. FIG. 5 is a schematic cross-sectional view taken along the line I-I' of FIG. 1 and the line II-II' of FIG. 3.

Referring to FIG. 3, a display device according to an embodiment includes the pad portion 50 at (e.g., in or on) the peripheral area PA, and the pad portion 50 includes the plurality of pads 51, 52, and 53. The pad portion 50 is connected to the fan-out wire portion 60. The fan-out wire portion 60 includes the plurality of fan-out wires 61, 62, and 63. The fan-out wires 61, 62, and 63 of the fan-out wire portion 60 may be connected to wires of the display area DA to transmit electrical signals from the plurality of pads 51, 52, and 53 of the pad portion 50 to each pixel of the display area DA.

The plurality of pads 51, 52, and 53 may be spaced apart from each other by as much as a suitable distance (e.g., a predetermined or certain distance) in a first direction. Although centers of the plurality of pads 51, 52, and 53 are shown in the diagram as being collinear with each other in the first direction, the present disclosure is not limited thereto, and the centers of the plurality of pads 51, 52, and 53 may be variously modified, for example, to be arranged in a zigzag shape in the first direction.

The fan-out wires 61, 62, and 63 may be connected to the pads 51, 52, and 53, respectively, and directions in which at least some of the fan-out wires 61, 62, and 63 extend may be different from another (e.g., from each other). In other words, the fan-out wires 61, 62, and 63 may extend at various suitable angles with respect to the first direction. In some embodiments, a distance between the fan-out wires 61, 62, and 63 near (e.g., adjacent to) the pad portion 50 may be less than that near (e.g., adjacent to) the display area DA.

The pads 51, 52, and 53 of the pad portion 50 and the fan-out wires 61, 62, and 63 of the fan-out wire portion 60 may be arranged at (e.g., in or on) different layers from each other. Accordingly, the first fan-out wire 61 may be connected to the first pad 51 through a first contact hole CNT1, the second fan-out wire 62 may be connected to the second pad 52 through a second contact hole CNT2, and the third fan-out wire 63 may be connected to the third pad 53 through a third contact hole CNT3.

In the present embodiment, a space under (e.g., at a lower end portion in a second direction of) the pad portion 50 may be reduced by overlapping the plurality of pads 51, 52, and 53 with the fan-out wires 61, 62, and 63, for example, by adjusting locations of the contact holes CNT1, CNT2, and CNT3. Accordingly, a dead space of the peripheral area PA may be reduced or minimized.

Figure 4:
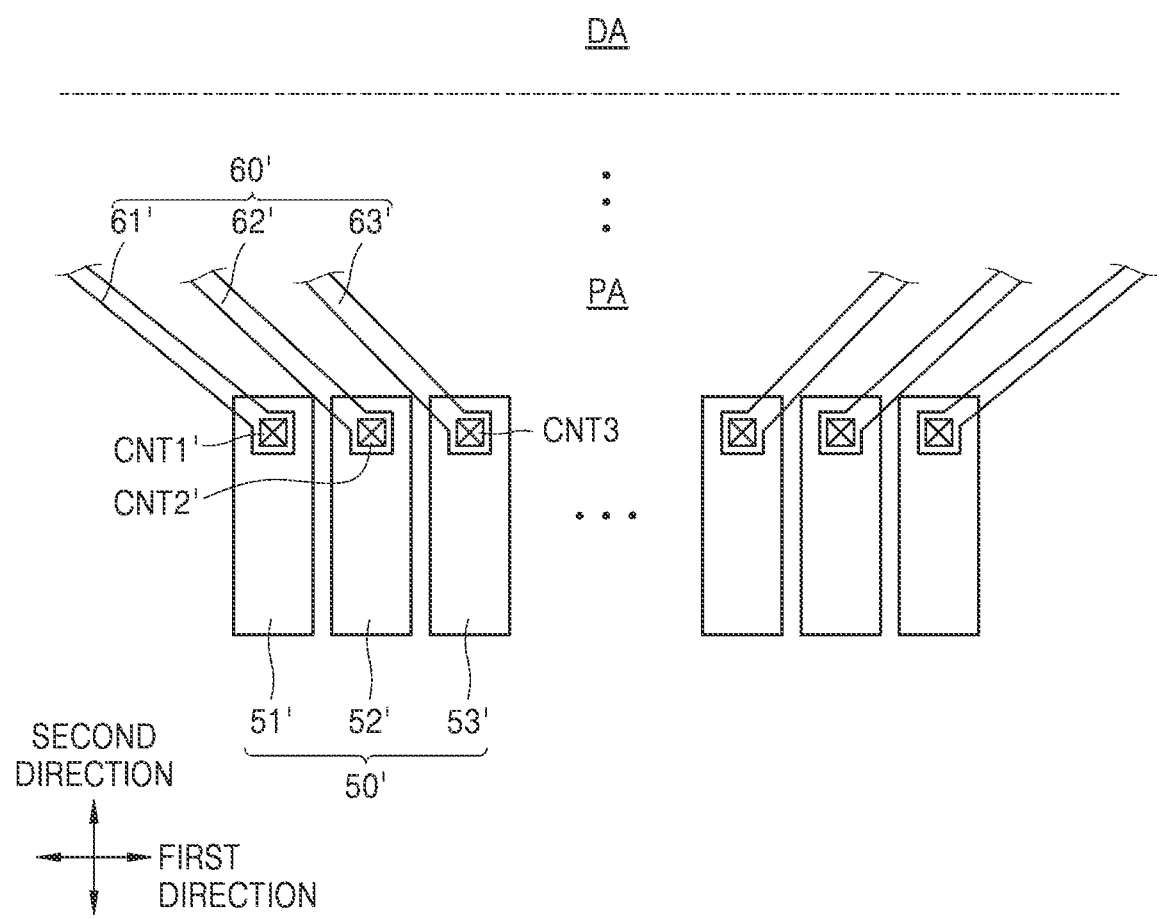
FIG. 4 shows a comparative example for comparison with one or more example embodiments.
Figure 5:
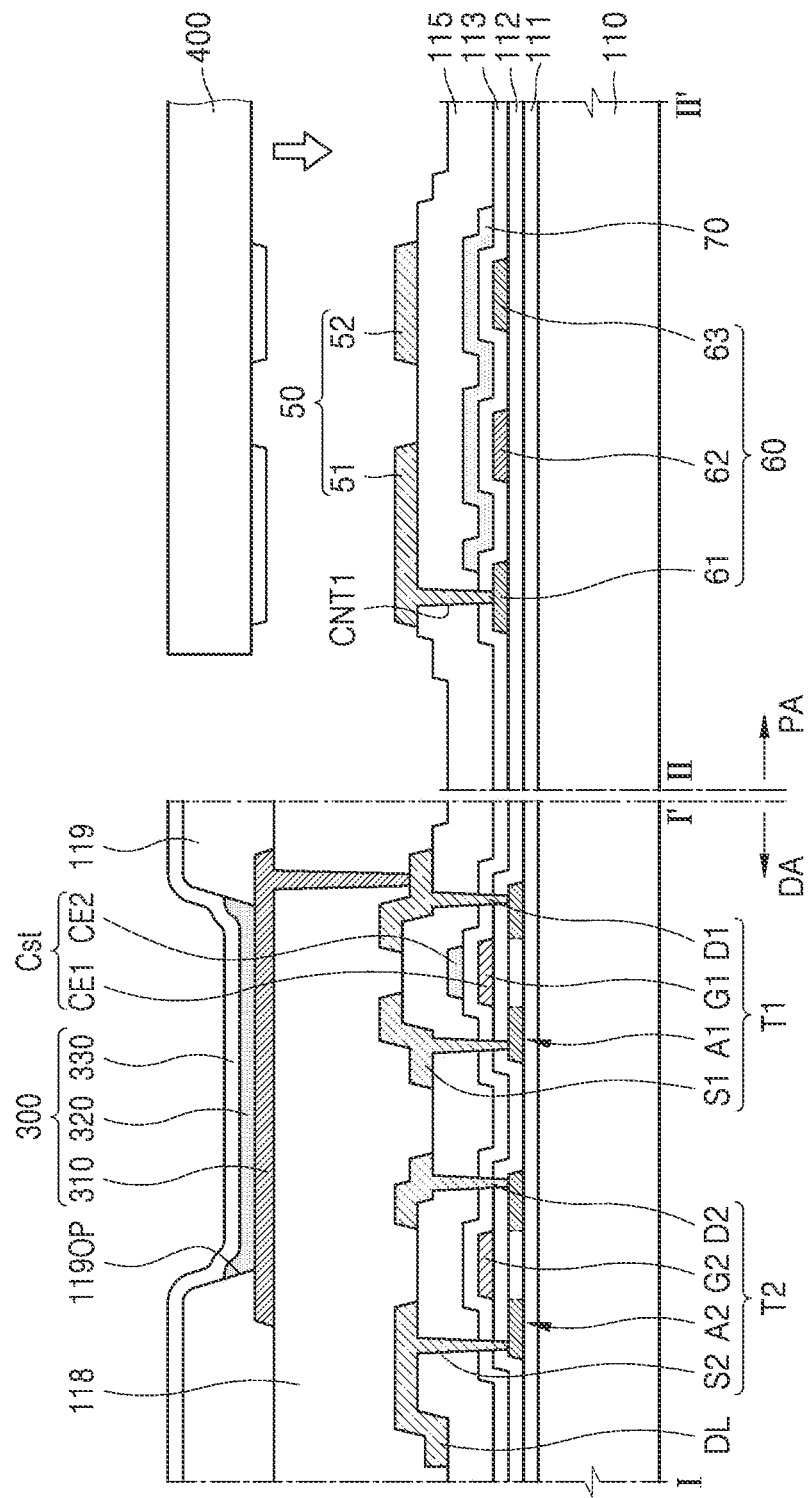
FIG. 5 is a schematic cross-sectional view taken along the line I-I' of FIG. 1 and the line II-II' of FIG. 3.

For example, referring to FIG. 4, which shows a comparative example, fan-out wires 61', 62', and 63' are connected to pads 51', 52', and 53' through contact holes CNT1', CNT2', and CNT3' at one end portion of the pads 51', 52', and 53', respectively, the end portion being adjacent to (e.g., located towards) the display area DA.

As the fan-out wires 61', 62', and 63' of FIG. 4 are connected to the pads 51', 52', and 53' at the end portion of the pads 51', 52', and 53', the first pad 51' and the second fan-out wire 62' do not overlap with each other. Accordingly, a space in which the pad portion 50' and the fan-out wire portion 60' are arranged at (e.g., in or on) the peripheral area PA may be significant (e.g., may be large).

However, in one or more embodiments of the present disclosure, for example, according to FIG. 3, the pad portion 50 may be closer to the display area DA than the pad portion 50' of FIG. 4. Accordingly, the contact holes CNT1, CNT2, and CNT3 may be arranged at (e.g., in) centers of the pads 51, 52, and 53 rather than at the end portions of the pads 51, 52, and 53 that are adjacent to the display area DA, or the contact holes CNT1, CNT2, and CNT3 may be arranged at (e.g., in) end portions (e.g., opposite end portions) of the pads 51, 52, and 53 that are not adjacent to the display area DA from among the end portions of the pads 51, 52, and 53.

Further, the fan-out wire portion 60 according to one or more embodiments has a structure in which a fan-out wire connected to one pad overlaps with another pad. For example, the second fan-out wire 62 connected to the second pad 52 may overlap with the first pad 51, and the third fan-out wire 63 connected to the third pad 53 may overlap with the second pad 52.

As described above, as the fan-out wire portion 60 overlaps with the pad portion 50, a signal interference effect may occur between the second fan-out wire 62 and the first pad 51 that applies different signals from each other, and/or between the third fan-out wire 63 and the second pad 52.

In the present embodiment, the conductive layer 70 is introduced to prevent or substantially prevent such signal interference effect. The conductive layer 70 may correspond to an overlapping area of the fan-out wire portion 60 and the pad portion 50. For example, the conductive layer 70 may be arranged between the fan-out wire portion 60 and the pad portion 50.

A constant voltage $V_0$ may be applied to the conductive layer 70. For example, the first power voltage ELVDD, the second power voltage ELVSS, or ground may be connected to the conductive layer 70. As the constant voltage $V_0$ is applied to the conductive layer 70, electrical signals applied to the pads 51, 52, and 53 arranged above the conductive layer 70 and the fan-out wires 61, 62, and 63 arranged below the conductive layer 70 may be stably transmitted to the display area DA.

In some embodiments, the conductive layer 70 may be connected to the first power voltage line 10 or the second power voltage line 20 (e.g., refer to FIG. 1). For example, an organic light-emitting diode including a pixel electrode, an intermediate layer including an organic emission layer, and an opposite electrode may be arranged at (e.g., in or on) the display area DA, and the same or substantially the same voltage as that of the second power voltage ELVSS that is applied to the opposite electrode may be provided to the conductive layer 70. In some embodiments, the conductive layer 70 may be connected to one pad of the pad portion 50 to receive the constant voltage $V_0$ from the controller as described above.

The conductive layer 70 may be arranged as one conductive layer 70 corresponding to the plurality of pads 51, 52, and 53. If the conductive layer 70 includes a plurality of pieces (e.g., a plurality of separate portions) corresponding to the plurality of pads 51, 52, and 53, respectively, wires for applying a constant voltage to each piece (e.g., to each portion) may be connected to apply a constant voltage to the conductive layer 70. In the present embodiment, the plurality of pads 51, 52, and 53 may correspond to one conductive layer 70, and thus, the number of wires for applying the constant voltage $V_0$ to the conductive layer 70 may be reduced.

In addition, a controller 400 (e.g., refer to FIG. 5) may be compression-bonded onto the pad portion 50, and thus, the conductive layer 70 may prevent or substantially prevent a crack from occurring during compression bonding, and/or may prevent or substantially prevent a short circuit from occurring in the pad portion 50 and the fan-out wire portion 60 even when a crack occurs.

Hereinafter, a structure in which various configurations included in a display device are stacked according to one or more embodiments will be described with reference to FIG. 5. FIG. 5 is a schematic cross-sectional view taken along the line I-I' of FIG. 1 and the line II-II' of FIG. 3.

The substrate 110 may include one or more various suitable materials, for example, such as a glass material, a metal material, and/or a plastic material. According to an embodiment, the substrate 110 may be a flexible substrate, and may include, for example, a polymer resin such as polyethersulfone (PES), polyacrylate, polyetherimide (PEI), polyethylene naphthalate (PEN), polyethylene terephthalate (PET), polyphenylene sulfide (PPS), polyarylate (PAR), polyimide (PI), polycarbonate (PC), or cellulose acetate propionate (CAP).

A buffer layer 111 may be arranged on the substrate 110 to reduce or prevent penetration of foreign materials, moisture, and/or external air from the bottom of the substrate 110, and to provide a flat or substantially flat surface on the substrate 110. The buffer layer 111 may include an inorganic material, for example, such as oxide or nitride, an organic material, or an organic-inorganic complex material, and may have a single-layer structure or multi-layered structure of an inorganic material and an organic material. A barrier layer for preventing or reducing penetration of external air may be further arranged between the substrate 110 and the buffer layer 111.

A first thin film transistor T1 includes a semiconductor layer A1, a gate electrode G1, a source electrode S1, and a drain electrode D1. A second thin film transistor T2 includes a semiconductor layer A2, a gate electrode G2, a source electrode S2, and a drain electrode D2. The first thin film transistor T1 may be connected to an organic light-emitting diode 300 to serve as a driving thin film transistor for driving the organic light-emitting diode 300. The second thin film transistor T2 may be connected to the data line DL to serve as a switching thin film transistor. However, the present disclosure is not limited thereto. For example, the first thin film transistor T1 may serve as a switching thin film transistor, and the second thin film transistor T2 may serve as a driving thin film transistor. Although two thin film transistors are shown in FIG. 5, the present disclosure is not limited thereto, and the number of thin film transistors may be variously modified, for example, from 2 to 7.

The semiconductor layers A1 and A2 may include amorphous silicon or polysilicon. According to another embodiment, the semiconductor layers A1 and A2 may include an oxide of at least one material selected from the group including indium (In), gallium (Ga), tin (Sn), zirconium (Zr), vanadium (V), hafnium (Hf), cadmium (Cd), germanium (Ge), chromium (Cr), titanium (Tl), and zinc (Zn). The semiconductor layers A1 and A2 may include a channel region, and source and drain regions doped with impurities.

The gate electrodes G1 and G2 are arranged above the semiconductor layers A1 and A2 with the first gate insulating layer 112 therebetween. The gate electrodes G1 and G2 may include molybdenum (Mo), aluminum (Al), copper (Cu), titanium (Ti), and/or the like, and may have a single-layer structure or multi-layered structure. As an example, the gate electrodes G1 and G2 may include a single Mo layer.

The first gate insulating layer 112 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A second gate insulating layer 113 may be provided to cover the gate electrodes G1 and G2. The second gate insulating layer 113 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

A first electrode CE1 of the storage capacitor Cst may overlap with the first thin film transistor T1. For example, the gate electrode G1 of the first thin film transistor T1 may serve as the first electrode CE1 of the storage capacitor Cst.

A second electrode CE2 of the storage capacitor Cst may overlap with the first electrode CE1 with the second gate insulating layer 113 therebetween. In this case, the second gate insulating layer 113 may serve as a dielectric layer of the storage capacitor Cst. The second electrode CE2 may include a conductive material including molybdenum (Mo), aluminum (Al), copper (Cu), titanium (Ti), and/or the like, and may have a multi-layered structure or single-layer structure including one or more of the materials described above. As an example, the second electrode CE2 may include a single Mo layer or multiple layers of Mo/Al/Mo.

The source electrodes S1 and S2 and the drain electrodes D1 and D2 are arranged on an interlayer insulating layer 115. The source electrodes S1 and S2 and the drain electrodes D1 and D2 may include a conductive material including molybdenum (Mo), aluminum (Al), copper (Cu), titanium (Ti), and/or the like, and may have a multi-layered structure or single-layer structure including one or more of the materials described above. As an example, the source electrodes S1 and S2 and the drain electrodes D1 and D2 may have a multi-layered structure of Ti/Al/Ti.

A planarization layer 118 may be on the source electrodes S1 and S2 and the drain electrodes D1 and D2, and the organic light-emitting diode 300 may be on the planarization layer 118.

The planarization layer 118 may have a flat or substantially flat upper surface so that a pixel electrode 310 may be formed to be flat or substantially flat. The planarization layer 118 may include a single layer or multiple layers of an organic material. The planarization layer 118 may include a general commercial polymer, for example, such as benzocyclobutene (BCB), PI, hexamethyldisiloxane (HMDSO), poly(methyl methacrylate) (PMMA), or polystyrene (PS), a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. The planarization layer 118 may include an inorganic material. The planarization layer 118 may include, for example, silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). When the planarization layer 118 includes an inorganic material, chemical planarization polishing may be performed in some cases. The planarization layer 118 may include both of an organic material and an inorganic material.

At (e.g., in or on) the display area DA of the substrate 110, the organic light-emitting diode 300 is arranged on the planarization layer 118. The organic light-emitting diode 300 includes the pixel electrode 310, an intermediate layer 320 including an organic emission layer, and an opposite electrode 330.

The planarization layer 118 has an opening portion exposing one of the source electrode S1 and the drain electrode D1 of the first thin film transistor T1, and the pixel electrode 310 contacts the source electrode S1 or the drain electrode D1 through the opening portion, and thus, is electrically connected to the first thin film transistor T1.

The pixel electrode 310 may be a (semi)transmissive electrode or a reflective electrode. In some embodiments, the pixel electrode 310 may include a reflective film including, for example, silver (Ag), magnesium (Mg), aluminum (Al), platinum (Pt), palladium (Pd), gold (Au), nickel (Ni), neodymium (Nd), iridium (Ir), chromium (Cr), and/or a compound thereof, and a transparent or semi-transparent electrode layer on the reflective film. The transparent or semi-transparent electrode layer may include at least one selected from the group including indium tin oxide (ITO), indium zinc oxide (IZO), zinc oxide (ZnO), indium oxide ($In_2O_3$), indium gallium oxide (IGO), and aluminum zinc oxide (AZO).

A pixel-defining layer 119 may be arranged on the planarization layer 118, and the pixel-defining layer 119 may have an opening corresponding to each sub-pixel at (e.g., in or on) the display area DA. In other words, the pixel-defining layer 119 may have an opening portion 1190P exposing at least a center portion of the pixel electrode 310, and thus, may define an emission area of the pixel. In addition, the pixel-defining layer 119 may prevent or substantially prevent an arc and/or the like from occurring at an edge of the pixel electrode 310 by increasing a distance between the edge of the pixel electrode 310 and the opposite electrode 330 arranged over the pixel electrode 310. The pixel-defining layer 119 may be formed by a suitable method, for example, such as spin coating, using one or more organic insulating materials selected from the group including PI, polyamide, acrylic resin, BCB, and phenolic resin.

The intermediate layer 320 of the organic light-emitting diode 300 may include an organic emission layer. The organic emission layer may include an organic material including a fluorescent material or a phosphorescent material for emitting a red light, a green light, a blue light, or a white light. The organic emission layer may include a low-molecular weight organic material or a polymer organic material, and one or more functional layers, for example, such as a hole transport layer (HTL), a hole injection layer (HIL), an electron transport layer (ETL), and/or an electron injection layer (EIL), may be selectively further arranged under and/or above (e.g., on) the organic emission layer. The intermediate layer 320 may correspond to each of a plurality of pixel electrodes 310. However, the present disclosure is not limited thereto, and the intermediate layer 320 may be variously modified, for example, to include an integral layer over the plurality of pixel electrodes 310.

The opposite electrode 330 may be a transmissive electrode or a reflective electrode. In some embodiments, the opposite electrode 330 may be a transparent or semi-transparent electrode, and may include a metal thin film having a small work function, which includes lithium (Li), calcium (Ca), lithium fluoride/calcium (LiF/Ca), lithium fluoride/aluminum (LiF/Al), aluminum (Al), silver (Ag), magnesium (Mg), and/or a compound thereof. In addition to the metal thin film, a transparent conductive oxide (TCO) film such as ITO, IZO, ZnO, or $In_2O_3$ may be further arranged. The opposite electrode 330 may be arranged over the display area DA and the peripheral area PA, and may be arranged on the intermediate layer 320 and the pixel-defining layer 119. The opposite electrode 330 may be integrally formed for a plurality of organic light-emitting diodes 300 to correspond to the plurality of pixel electrodes 310.

The fan-out wires 61, 62, and 63 may be provided at (e.g., in or on) the same layer as that of the gate electrodes G1 and G2, and may be arranged at (e.g., in or on) the peripheral area PA. In other words, the fan-out wires 61, 62, and 63 may be arranged on the first gate insulating layer 112. The fan-out wires 61, 62, and 63 may include the same or substantially the same material as that of the gate electrodes G1 and G2. The fan-out wires 61, 62, and 63 may include molybdenum (Mo), aluminum (Al), copper (Cu), titanium (Ti), and/or the like, and may have a single-layer structure or a multi-layered structure. As an example, the fan-out wires 61, 62, and 63 may include a single Mo layer.

In some embodiments, some of the fan-out wires 61, 62, and 63 arranged at (e.g., in or on) the peripheral area PA may be arranged on the second gate insulating layer 113 or the interlayer insulating layer 115, and some thereof may be arranged on the first gate insulating layer 112 and connected through a contact hole.

The fan-out wires 61, 62, and 63 may be connected to wires in the display area DA to transmit an electrical signal, for example, such as a data signal, a gate signal, or a driving voltage, to the display area DA.

The pads 51 and 52 may be arranged at (e.g., in or on) the same layer as that of the data line DL. In other words, the pads 51 and 52 may be arranged on the interlayer insulating layer 115 at (e.g., in or on) the peripheral area PA. The first pad 51 may contact the first fan-out wire 61 through the first contact hole CNT1 penetrating the interlayer insulating layer 115 and the second gate insulating layer 113.

The first pad 51 is connected to the first fan-out wire 61 through the first contact hole CNT1, and the first pad 51 and the second fan-out wire 62 partially overlap with each other. Accordingly, a signal transmitted from the first pad 51 may affect a signal transmitted by the second fan-out wire 62. To prevent or substantially prevent such a coupling phenomenon, the conductive layer 70 corresponds to an overlapping area of, and may be between, the first pad 51 and the second fan-out wire 62.

The conductive layer 70 may be arranged between a lower portion of the pad portion 50 and an upper portion of the fan-out wire portion 60. For example, the conductive layer 70 may be arranged on the second gate insulating layer 113. The conductive layer 70 may be formed of the same or substantially the same material and at (e.g., in or on) the same layer as that of the second electrode CE2 of the storage capacitor Cst. The conductive layer 70 may include a conductive material including molybdenum (Mo), aluminum (Al), copper (Cu), titanium (Ti), and/or the like, and may have a multi-layered structure or a single-layer structure including one or more of the materials described above. As an example, the conductive layer 70 may include a single Mo layer or multiple layers of Mo/Al/Mo.

The conductive layer 70 may correspond to the plurality of pads 51 and 52 and the plurality of fan-out wires 61, 62, and 63. For example, the conductive layer 70 may extend from an overlapping area of the first pad 51 and the second fan-out wire 62 to an overlapping area of the second pad 52 and the third fan-out wire 63. In some embodiments, one conductive layer 70 may correspond to portions of all the plurality of pads 51, 52, and 53 included in the pad portion 50 (e.g., refer to FIG. 3).

The controller 400, for example, such as a driving circuit chip or a printed circuit board, may be attached onto the pad portion 50 by compression bonding in which pressure and/or heat is applied, and in this regard, an anisotropic conductive film (ACF) may be used. The ACF includes an adhesive cured by heat and fine conductive particles dispersed in the adhesive, and may be formed of a double-sided tape. Accordingly, when pressure is applied from upper and lower portions of the ACF, the conductive particles may explode, and thus, the adhesive inside may be completely filled in the double-sided tape, thereby achieving conductivity and adherence.

As described above, pressure may be applied when the controller 400 is attached to the pad portion 50, and thus, a crack may occur in the interlayer insulating layer 115, and/or the like under the plurality of pads 51 and 52. If the conductive layer 70 is not between the pad portion 50 and the fan-out wire portion 60, a leakage current may occur between the pad portion 50 and the overlapped fan-out wire portion 60 due to the crack.

However, in the present embodiment, the conductive layer 70 is arranged below the pad portion 50 and overlaps therewith, and thus, the occurrence of a crack may be prevented or substantially prevented by dispersing pressure during compression bonding. In addition, even when a crack occurs in an insulating layer, a short circuit or a leakage current may not occur between the pad portion 50 and the fan-out wire portion 60 because the conductive layer 70 is arranged between the pad portion 50 and the fan-out wire portion 60.

Figure 6:
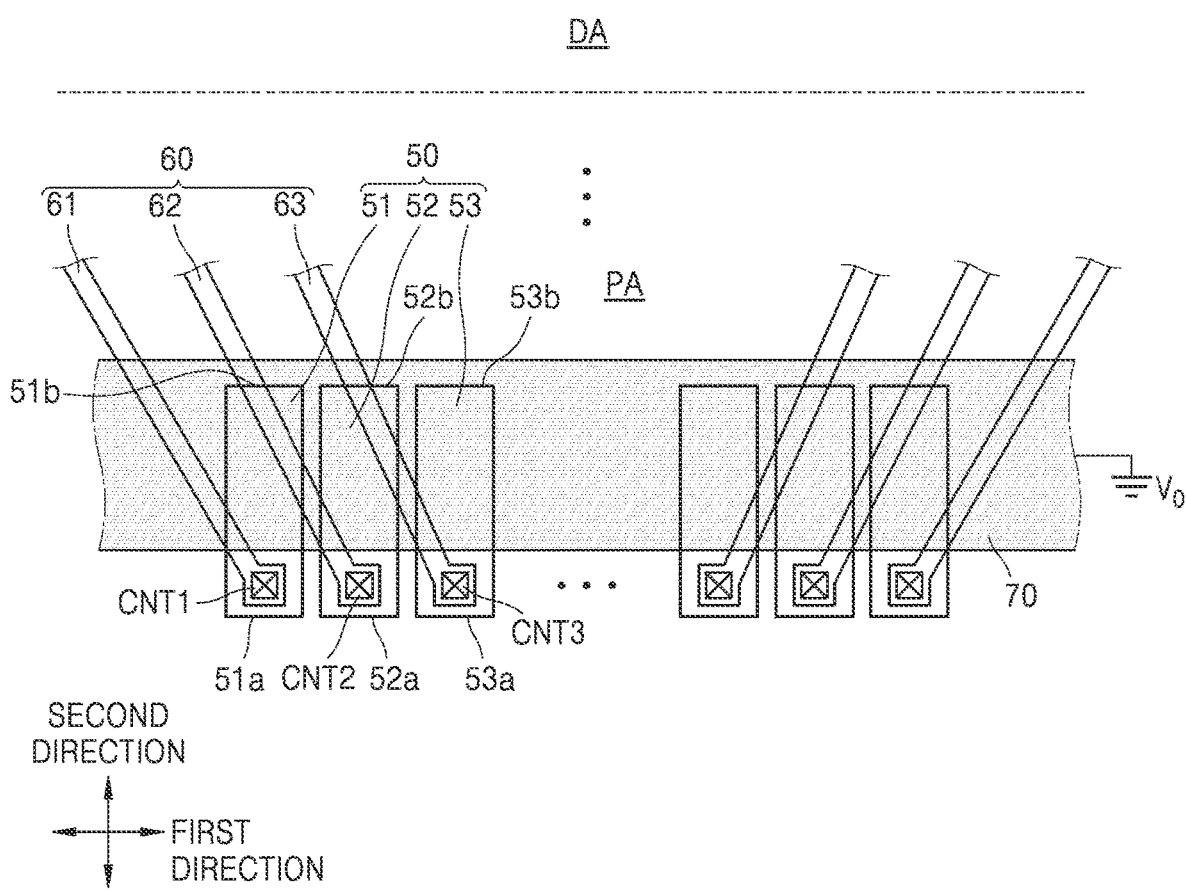
FIG. 6 is a schematic plan view of a portion of a display device according to another embodiment.

FIG. 6 is a plan view of a portion of a display device according to another embodiment. In FIG. 6, the same reference numerals as those in FIG. 3 denote the same or substantially the same elements, and thus, redundant description thereof may not be repeated.

Referring to FIG. 6, a display device according to one or more embodiments includes the pad portion 50 and the fan-out wire portion 60 at (e.g., in or on) the peripheral area PA. The pad portion 50 includes the plurality of pads 51, 52, and 53, and the fan-out wire portion 60 includes the fan-out wires 61, 62, and 63 connected to the plurality of pads 51, 52, and 53 through the contact holes CNT1, CNT2, and CNT3, respectively. The pad portion 50 and the fan-out wire portion 60 have an overlapping area, and the conductive layer 70 is arranged between a lower portion of the pad portion 50 and an upper portion of the fan-out wire portion 60 to correspond to the overlapping area.

In the present embodiment, locations of the contact holes CNT1, CNT2, and CNT3, which are portions where the plurality of pads 51, 52, and 53 and the fan-out wires 61, 62, and 63 are connected to each other, are arranged in first end portions 51a, 52a, and 53a of the plurality of pads 51, 52, and 53. The plurality of pads 51, 52, and 53 include the first end portions 51a, 52a, and 53a, and second end portions 51b, 52b, and 53b arranged between the first end portions 51a, 52a, and 53a and the display area DA. The first end portions 51a, 52a, and 53a refer to end portions of the pads 51, 52, and 53 that are not adjacent to (e.g., that are farther away from) the display area DA. Accordingly, the overlapping area of the pad portion 50 and the fan-out wire portion 60 may be widened, and a space of the peripheral area PA may be reduced.

The conductive layer 70 may correspond to the overlapping area of the pad portion 50 and the fan-out wire portion 60. The conductive layer 70 may be arranged between a lower portion of the pad portion 50 and an upper portion of the fan-out wire portion 60 to block or substantially block an interference signal occurring between the pad portion 50 and the fan-out wire portion 60.

The constant voltage $V_0$ may be applied to the conductive layer 70. For example, the first power voltage ELVDD, the second power voltage ELVSS, or a ground voltage may be connected to the conductive layer 70. As the constant voltage $V_0$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

One conductive layer 70 corresponds to the plurality of pads 51, 52, and 53, and thus, a crack that may occur when the controller 400 (e.g., refer to FIG. 5) is compression-bonded to the pad portion 50 may be prevented or substantially prevented from occurring. Further, due to the arrangement of the conductive layer 70, a short circuit may be prevented or substantially prevented from occurring in the pad portion 50 and the fan-out wire portion 60 even when a crack occurs.

Figure 7:
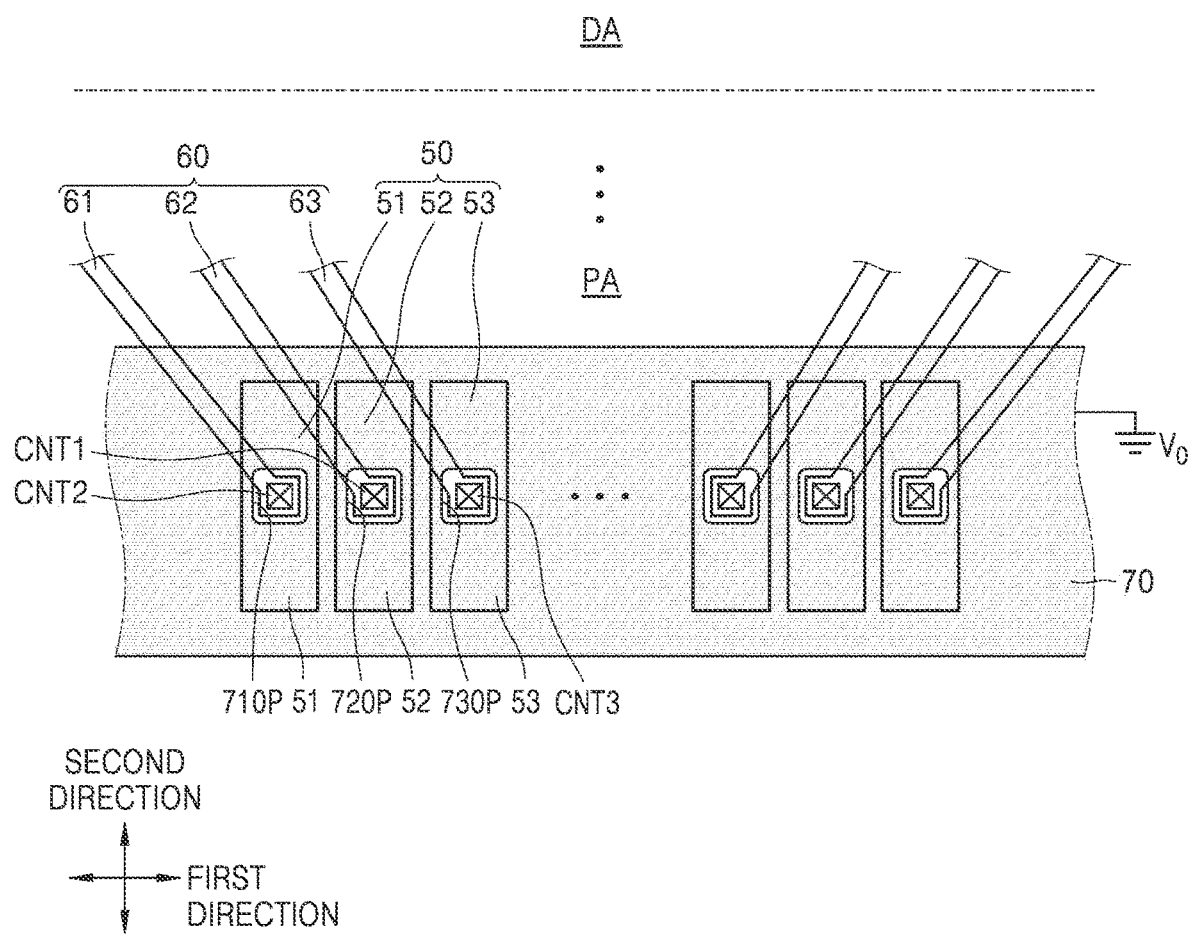
FIG. 7 is a schematic plan view of a portion of a display device according to another embodiment.

FIG. 7 is a plan view of a portion of a display device according to another embodiment. In FIG. 7, the same reference numerals as those in FIG. 3 denote the same or substantially the same elements, and thus, redundant description thereof may not be repeated.

Referring to FIG. 7, a display device according to one or more embodiments includes the pad portion 50 and the fan-out wire portion 60 at (e.g., in or on) the peripheral area PA. The pad portion 50 includes the plurality of pads 51, 52, and 53, and the fan-out wire portion 60 includes the fan-out wires 61, 62, and 63 connected to the plurality of pads 51, 52, and 53 through the contact holes CNT1, CNT2, and CNT3, respectively. The pad portion 50 and the fan-out wire portion 60 have an overlapping area, and the conductive layer 70 is arranged between a lower portion of the pad portion 50 and an upper portion of the fan-out wire portion 60 to correspond to the overlapping area.

In the present embodiment, an area of the conductive layer 70 may be greater than or equal to a total area of the plurality of pads 51, 52, and 53. In this case, the conductive layer 70 may include openings 71OP, 72OP, and 73OP corresponding to the contact holes CNT1, CNT2, and CNT3. Accordingly, the first pad 51 may be connected to the first fan-out wire 61 through the first contact hole CNT1 arranged inside the first opening 71OP, the second pad 52 may be connected to the second fan-out wire 62 through the second contact hole CNT2 arranged inside the second opening 72OP, and the third pad 53 may be connected to the third fan-out wire 63 through the third contact hole CNT3 arranged inside the third opening 73OP.

As an area of the conductive layer 70 is greater than or equal to a total area (e.g., an entire area) of the plurality of pads 51, 52, and 53, a more rigid structure against pressure applied when the controller 400 (e.g., refer to FIG. 5) is compression-bonded to the pad portion 50 may be provided.

The conductive layer 70 is arranged between a lower portion of the pad portion 50 and an upper portion of the fan-out wire portion 60, and thus, may block or substantially block an interference signal from occurring between the pad portion 50 and the fan-out wire portion 60.

The constant voltage $V_0$ may be applied to the conductive layer 70. For example, the first power voltage ELVDD, the second power voltage ELVSS, or a ground voltage may be connected to the conductive layer 70. As the constant voltage $V_0$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

Figure 8:
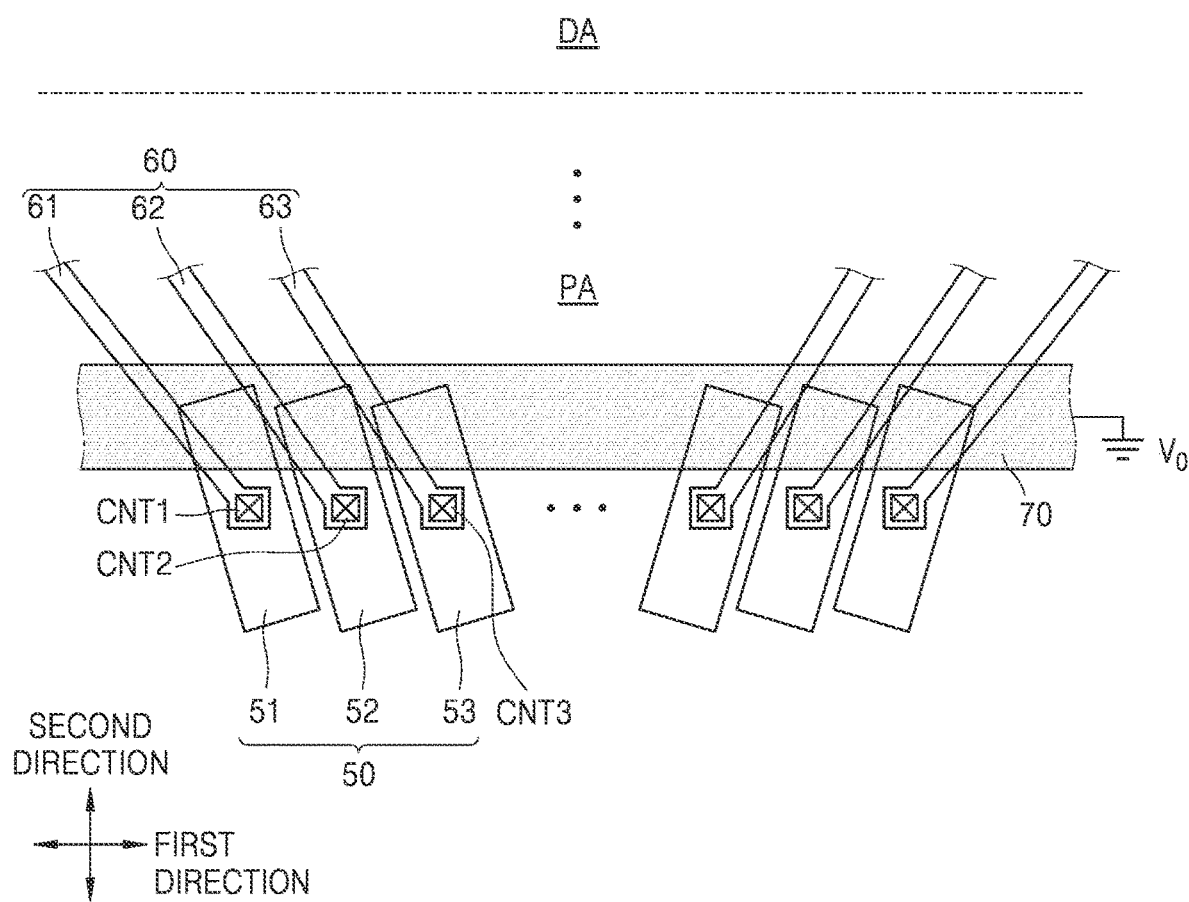
FIG. 8 is a schematic plan view of a portion of a display device according to another embodiment.

FIG. 8 is a plan view of a portion of a display device according to another embodiment. In FIG. 8, the same reference numerals as those in FIG. 3 denote the same or substantially the same elements, and thus, redundant description thereof may not be repeated.

Referring to FIG. 8, a display device according to one or more embodiments includes the pad portion 50 and the fan-out wire portion 60 at (e.g., in or on) the peripheral area PA. The pad portion 50 includes the plurality of pads 51, 52, and 53, and the fan-out wire portion 60 includes the fan-out wires 61, 62, and 63 connected to the plurality of pads 51, 52, and 53 through the contact holes CNT1, CNT2, and CNT3, respectively. The pad portion 50 and the fan-out wire portion 60 have an overlapping area, and the conductive layer 70 is arranged between a lower portion of the pad portion 50 and an upper portion of the fan-out wire portion 60 to correspond to the overlapping area.

In the present embodiment, centers of the plurality of pads 51, 52, and 53 are collinear in a first direction, and extending directions of the plurality of pads 51, 52, and 53 are inclined in a direction between the first direction and a second direction. However, the present disclosure is not limited thereto, and the plurality of pads 51, 52, and 53 may be arranged in various suitable shapes. For example, the plurality of pads 51, 52, and 53 may be inclined at various suitable angles, and the centers of the plurality of pads 51, 52, and 53 may not be collinear in the first direction but may be arranged in a zigzag shape.

The conductive layer 70 may correspond to the overlapping area of the pad portion 50 and the fan-out wire portion 60. The conductive layer 70 may be arranged between a lower portion of the pad portion 50 and an upper portion of the fan-out wire portion 60 to block or substantially block an interference signal from occurring between the pad portion 50 and the fan-out wire portion 60.

The constant voltage $V_O$ may be applied to the conductive layer 70. For example, the first power voltage ELVDD, the second power voltage ELVSS, or a ground voltage may be connected to the conductive layer 70. As the constant voltage $V_O$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

One conductive layer 70 corresponds to the plurality of pads 51, 52, and 53, and thus, a crack that may occur when the controller 400 (e.g., refer to FIG. 5) is compression-bonded to the pad portion 50 may be prevented or substantially prevented from occurring. Further, due to the arrangement of the conductive layer 70, a short circuit may be prevented or substantially prevented from occurring in the pad portion 50 and the fan-out wire portion 60 even when a crack occurs.

Figure 9:
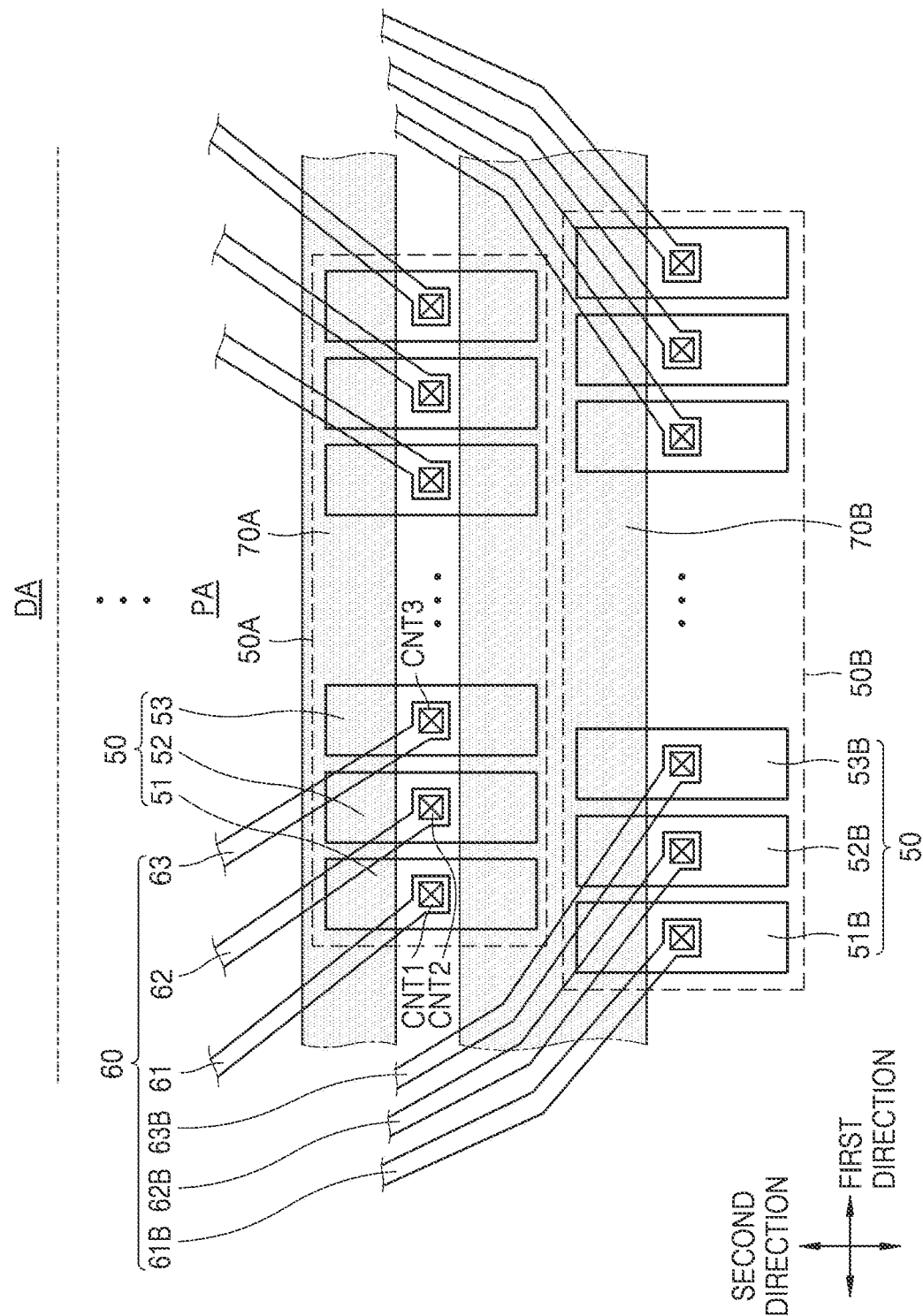
FIG. 9 is a schematic plan view of a portion of a display device according to another embodiment.

FIG. 9 is a plan view of a portion of a display device according to another embodiment. In FIG. 9, the same reference numerals as those in FIG. 3 denote the same or substantially the same elements, and thus, redundant description thereof may not be repeated.

Referring to FIG. 9, a display device according to one or more embodiments includes the pad portion 50 and the fan-out wire portion 60 at (e.g., in or on) the peripheral area PA. The pad portion 50 includes the plurality of pads 51, 52, and 53, and the fan-out wire portion 60 includes the fan-out wires 61, 62, and 63 connected to the plurality of pads 51, 52, and 53 through the contact holes CNT1, CNT2, and CNT3, respectively. The pad portion 50 and the fan-out wire portion 60 have an overlapping area, and the conductive layer 70 (e.g., 70A and 70B in FIG. 9) is arranged between a lower portion of the pad portion 50 and an upper portion of the fan-out wire portion 60 to correspond to the overlapping area.

In the present embodiment, the pad portion 50 may include a first sub-pad portion 50A and a second sub-pad portion 50B. The first sub-pad portion 50A may include the plurality of pads 51, 52, and 53 extending in a first direction, and the second sub-pad portion 50B may include a plurality of pads 51B, 52B, and 53B extending in the first direction. The first sub-pad portion 50A and the second sub-pad portion 50B may be arranged along a second direction crossing the first direction. In other words, the pad portion 50 may be provided in two tiers. However, the present disclosure is not limited thereto, and for example, the pad portion 50 may be provided in a plurality of tiers of three or more.

The conductive layer 70 may include a first sub-conductive layer 70A corresponding to the first sub-pad portion 50A, and a second sub-conductive layer 70B corresponding to the second sub-pad portion 50B. The first sub-conductive layer 70A may be arranged between a lower portion of the first sub-pad portion 50A and an upper portion of the fan-out wire portion 60, and the second sub-conductive layer 70B may be arranged between a lower portion of the second sub-pad portion 50B and an upper portion of the fan-out wire portion 60.

The first sub-conductive layer 70A and the second sub-conductive layer 70B may be spaced apart from each other. In addition, the first sub-conductive layer 70A and the second sub-conductive layer 70B may not overlap with the contact holes CNT1, CNT2, and CNT3.

The second sub-conductive layer 70B may partially overlap with the first sub-pad portion 50A. In other words, the second sub-conductive layer 70B may overlap with a portion of the first sub-pad portion 50A and a portion of the second sub-pad portion 50B.

The conductive layer 70 may be arranged between a lower portion of the pad portion 50 and an upper portion of the fan-out wire portion 60 to block or substantially block an interference signal from occurring between the pad portion 50 and the fan-out wire portion 60.

The constant voltage $V_O$ may be applied to the conductive layer 70. For example, the first power voltage ELVDD, the second power voltage ELVSS, or a ground voltage may be connected to the conductive layer 70. As the constant voltage $V_O$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

The conductive layer 70 corresponds to the plurality of pads 51, 52, and 53, and thus, a crack that may occur when the controller 400 (e.g., refer to FIG. 5) is compression-bonded to the pad portion 50 may be prevented or substantially prevented from occurring. Further, due to the arrangement of the conductive layer 70, a short circuit may be prevented or substantially prevented from occurring in the pad portion 50 and the fan-out wire portion 60 even when a crack occurs.

Figure 10:
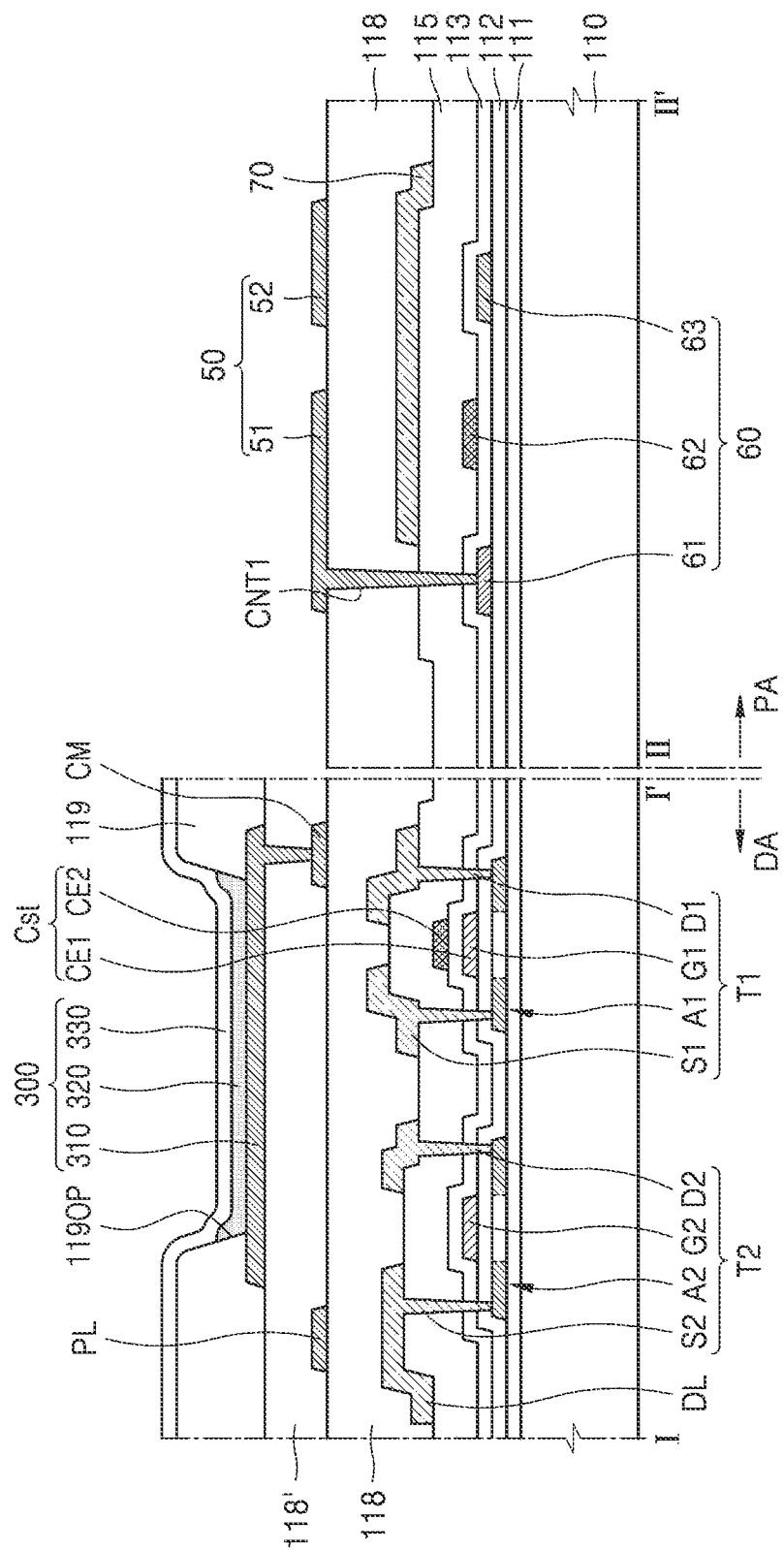
FIG. 10 is a schematic cross-sectional view of a portion of a display device according to another embodiment.

FIG. 10 is a cross-sectional view of a portion of a display device according to another embodiment. In FIG. 10, the same reference numerals as those in FIG. 5 denote the same or substantially the same elements, and thus, redundant description thereof may not be repeated.

Referring to FIG. 10, a display device according to one or more embodiments includes the pad portion 50 and the fan-out wire portion 60 at (e.g., in or on) the peripheral area PA. The pad portion 50 includes the plurality of pads 51 and 52, and the fan-out wire portion 60 includes the fan-out wires 61, 62, and 63 overlapping with the plurality of pads 51 and 52. The pad portion 50 and the fan-out wire portion 60 have an overlapping area, and the conductive layer 70 is arranged between a lower portion of the pad portion 50 and an upper portion of the fan-out wire portion 60 to correspond to the overlapping area.

The display device according to one or more embodiments may further include an upper-planarization layer 118' on the planarization layer 118. In addition, the upper-planarization layer 118' may further include an additional wire PL and an intermediate wire CM.

The upper-planarization layer 118' may include an organic material and/or an inorganic material. For example, the organic material may include a general commercial polymer such as BCB, PI, HMDSO, PMMA, or PS, a polymer derivative having a phenol-based group, an acryl-based polymer, an imide-based polymer, an aryl ether-based polymer, an amide-based polymer, a fluorine-based polymer, a p-xylene-based polymer, a vinyl alcohol-based polymer, and/or a blend thereof. The inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The upper-planarization layer 118' may have a single-layer structure or a multi-layered structure.

The additional wire PL arranged on the planarization layer 118 may serve as a driving voltage line for transmitting a driving voltage, or a data line for transmitting a data signal. The additional wire PL may be connected to the data line DL through a contact hole defined in the planarization layer 118. In addition, the pixel electrode 310 of the organic light-emitting diode OLED and the first thin film transistor T1 may be connected to each other through the intermediate wire CM arranged on the planarization layer 118. The additional wire PL and the intermediate wire CM may include molybdenum (Mo), aluminum (Al), copper (Cu), titanium (Ti), and/or the like, and may have a multi-layered structure or a single-layer structure.

In the present embodiment, the plurality of pads 51 and 52 may be arranged on the planarization layer 118. The plurality of pads 51 and 52 may be formed of the same or substantially the same material and at (e.g., in or on) the same layer as that of the additional wire PL. The plurality of pads 51 and 52 may include molybdenum (Mo), aluminum (Al), copper (Cu), titanium (Ti), and/or the like, and may have a multi-layered structure or a single-layer structure.

The conductive layer 70 may be arranged on the interlayer insulating layer 115, and may be formed of the same or substantially the same material and at (e.g., in or on) the same layer as that of the data line DL, the source electrodes S1 and S2, or the drain electrodes D1 and D2.

Some of the fan-out wires 61, 62, and 63 may be arranged on the first gate insulating layer 112, and some of the fan-out wires 61, 62, and 63 may be arranged on the second gate insulating layer 113. For example, as shown in FIG. 10, the first fan-out wire 61 and the third fan-out wire 63 may be arranged on the first gate insulating layer 112, and may be formed of the same or substantially the same material and at (e.g., in or on) the same layer as that of the gate electrodes G1 and G2. The second fan-out wire 62 may be arranged on the second gate insulating layer 113, and may be formed of the same or substantially the same material and at (e.g., in or on) the same layer as that of the second electrode CE2 of the storage capacitor Cst. However, the present disclosure is not limited thereto, and various suitable modifications may be made, for example, all of the fan-out wires 61, 62, and 63 may be arranged on the first gate insulating layer 112 or may be arranged on the second gate insulating layer 113.

As layers at (e.g., in or on) which the fan-out wires 61, 62, and 63 may be arranged are diversified, distances between the fan-out wires 61, 62, and 63 may be reduced. Although not shown, in some embodiments, the first fan-out wire 61 and the second fan-out wire 62 that are arranged on different layers from each other may partially overlap with each other. Accordingly, distances between the fan-out wires 61, 62, and 63 may be reduced.

The constant voltage $V_0$ may be applied to the conductive layer 70. For example, the first power voltage ELVDD, the second power voltage ELVSS, or ground may be connected to the conductive layer 70. As the constant voltage $V_0$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

The conductive layer 70 may be arranged as one conductive layer 70 corresponding to the plurality of pads 51, 52, and 53. If the conductive layer 70 includes a plurality of pieces (e.g., a plurality of separate portions) corresponding to the plurality of pads 51, 52, and 53, respectively, wires for applying a constant voltage to each piece (e.g., to each portion) may be connected to apply a constant voltage to the conductive layer 70. In the present embodiment, the plurality of pads 51, 52, and 53 correspond to one conductive layer 70, and thus, the number of wires for applying the constant voltage $V_0$ to the conductive layer 70 may be reduced.

In addition, the controller 400 (e.g., refer to FIG. 5) may be compression-bonded onto the pad portion 50, and thus, the conductive layer 70 may prevent or substantially prevent a crack that may occur during compression bonding from occurring, and/or may prevent or substantially prevent a short circuit from occurring in the pad portion 50 and the fan-out wire portion 60 even when a crack occurs.

Figure 11:
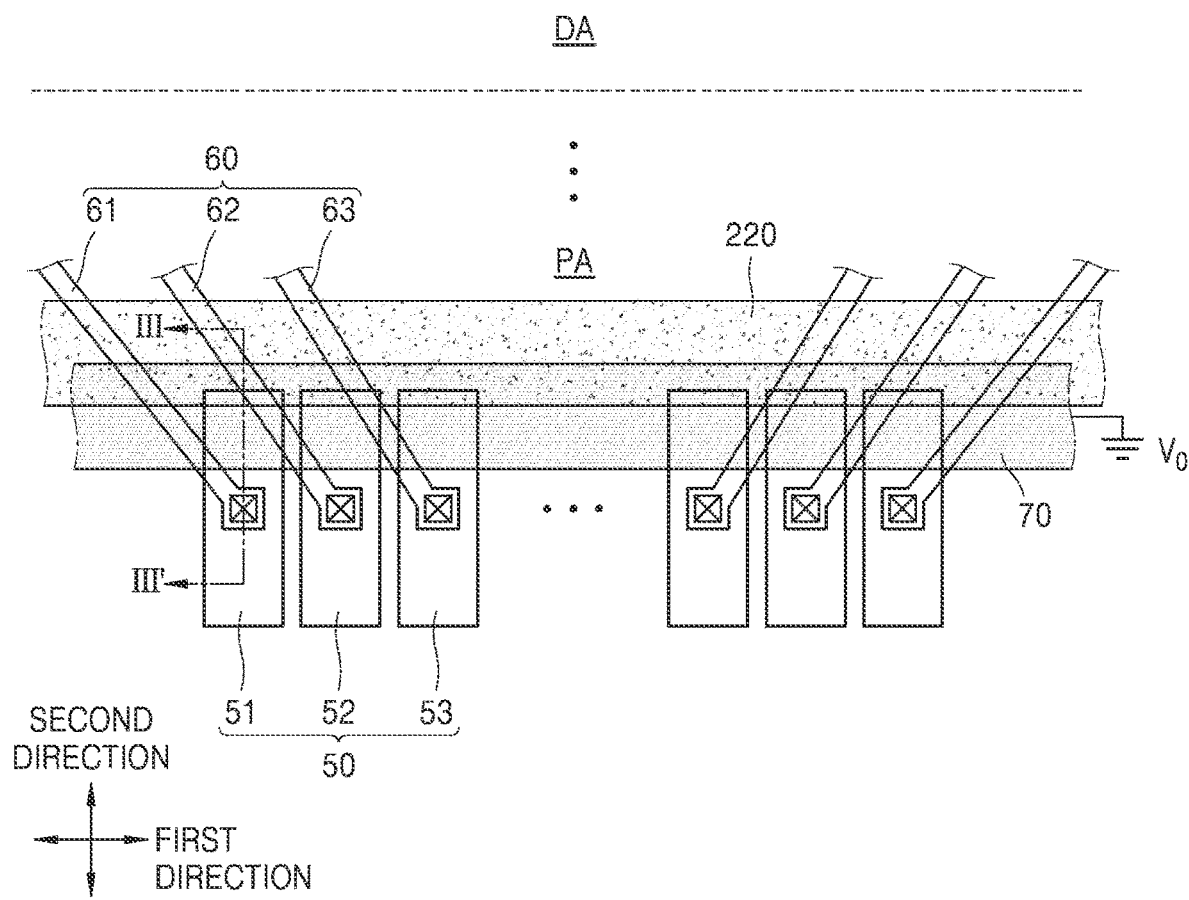
FIG. 11 is a schematic plan view of a portion of a display device according to another embodiment.
Figure 12:
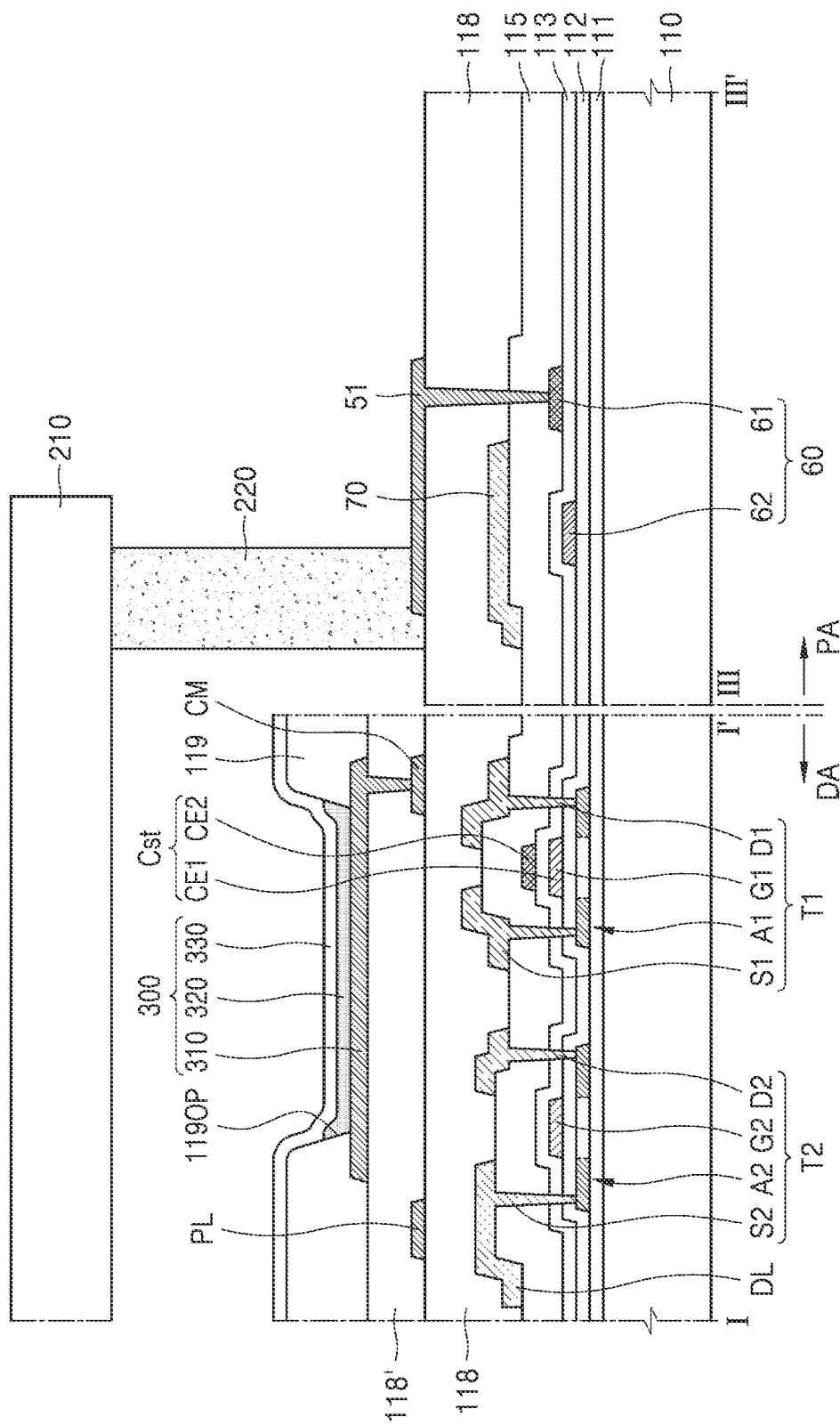
FIG. 12 is a schematic cross-sectional view of a portion of a display device according to another embodiment.

FIGS. 11 and 12 are a plan view and a cross-sectional view, respectively, of a portion of a display device according to another embodiment. In FIGS. 11 and 12, the same reference numerals as those in FIGS. 3 and 10 denote the same or substantially the same elements, and thus, redundant description thereof may not be repeated. The peripheral area PA of FIG. 12 shows a portion corresponding to the line III-III' of FIG. 11.

Referring to FIGS. 11 and 12, a display device according to one or more embodiments includes the pad portion 50 and the fan-out wire portion 60 at (e.g., in or on) the peripheral area PA. The pad portion 50 includes the plurality of pads 51, 52, and 53, and the fan-out wire portion 60 includes the fan-out wires 61, 62, and 63 overlapping with the plurality of pads 51, 52, and 53. The pad portion 50 and the fan-out wire portion 60 have an overlapping area, and the conductive layer 70 is arranged between a lower portion of the pad portion 50 and an upper portion of the fan-out wire portion 60 to correspond to the overlapping area.

In the present embodiment, the display area DA may be sealed with a sealing substrate 210 and a sealing member 220. The sealing substrate 210 may face the substrate 110 to cover the display area DA, and may be bonded to the substrate 110 by the sealing member 220 arranged at (e.g., in or on) the peripheral area PA.

The sealing substrate 210 may include a glass material, and/or the like. The sealing member 220 may include a frit that is cured by laser light. The sealing member 220 may be continuously arranged to surround (e.g., around a periphery of) the display area DA.

As the display area DA is sealed by the sealing substrate 210 and the sealing member 220, penetration of oxygen, moisture, and/or the like into the display area DA may be prevented or substantially prevented.

Referring to FIG. 12, in a display device according to the present embodiment, the sealing member 220 and the conductive layer 70 may partially overlap with each other. In another example, the sealing member 220 and the pad portion 50 may partially overlap with each other. Because the controller 400 (e.g., refer to FIG. 5) may be attached onto the pad portion 50, the sealing member 220 may partially overlap with the pad portion 50, and a non-overlapping portion may be secured.

As described above, as the sealing member 220 and the pad portion 50 partially overlap with each other, a space of the peripheral area PA may be further reduced.

The constant voltage $V_0$ may be applied to the conductive layer 70. For example, the first power voltage ELVDD, the second power voltage ELVSS, or ground may be connected to the conductive layer 70. As the constant voltage $V_0$ is applied to the conductive layer 70, electrical signals applied to the pads 51, 52, and 53 arranged above the conductive layer 70 and to the fan-out wires 61, 62, and 63 arranged below the conductive layer 70 may be stably transmitted to the display area DA.

The conductive layer 70 may be arranged as one conductive layer 70 corresponding to the plurality of pads 51, 52, and 53. If the conductive layer 70 includes a plurality of pieces (e.g., a plurality of separate portions) corresponding to the plurality of pads 51, 52, and 53, respectively, wires for applying a constant voltage to each piece (e.g., to each portion) may be connected to apply a constant voltage to the conductive layer 70. In the present embodiment, the plurality of pads 51, 52, and 53 correspond to one conductive layer 70, and thus, the number of wires for applying the constant voltage $V_0$ to the conductive layer 70 may be reduced.

In addition, the controller 400 (e.g., refer to FIG. 5) may be compression-bonded onto the pad portion 50, and thus, the conductive layer 70 may prevent or substantially prevent a crack that may occur during compression bonding from occurring, or may prevent or substantially prevent a short circuit from occurring in the pad portion 50 and the fan-out wire portion 60 even when a crack occurs.

In the present embodiment, the display area DA is sealed with the sealing substrate 210, but the present disclosure is not limited thereto. The display area DA may be sealed with a thin film encapsulation layer. The thin film encapsulation layer may have a structure in which a first inorganic encapsulation layer, an organic encapsulation layer, and a second inorganic encapsulation layer are stacked. Various functional layers, for example, such as a touchscreen layer and a polarizing film, may be further included on the thin film encapsulation layer or the sealing substrate 210, and a capping layer for improving light efficiency may be further included on the opposite electrode 330.

One or more example embodiments of the present disclosure have been described above. Such embodiments may be implemented as separate embodiments or may be implemented in combination with each other. Various suitable combinations may be made, for example, the example embodiment described with reference to FIG. 12 may be applied to the example embodiments described with reference to FIGS. 3 and 5 to 10.

Although some example embodiments have been described, those skilled in the art will readily appreciate that various modifications are possible in the example embodiments without departing from the spirit and scope of the present disclosure. It will be understood that descriptions of features or aspects within each embodiment should typically be considered as available for other similar features or aspects in other embodiments, unless otherwise described. Thus, as would be apparent to one of ordinary skill in the art, features, characteristics, and/or elements described in connection with a particular embodiment may be used singly or in combination with features, characteristics, and/or elements described in connection with other embodiments unless otherwise specifically indicated. Therefore, it is to be understood that the foregoing is illustrative of various example embodiments and is not to be construed as limited to the specific example embodiments disclosed herein, and that various modifications to the disclosed example embodiments, as well as other example embodiments, are intended to be included within the spirit and scope of the present disclosure as defined in the appended claims, and their equivalents.

The invention claimed is:

1. A display device comprising:
a substrate comprising a display area at which an image is displayed by a pixel, and a peripheral area around the display area;
a pad portion at the peripheral area, and comprising a first pad and a second pad adjacent to each other;
a fan-out wire portion comprising a first fan-out wire below the first pad and connected to the first pad through a first contact hole to extend to the display area, and a second fan-out wire below the second pad and connected to the second pad through a second contact hole to extend to the display area; and
a conductive layer between an upper portion of the fan-out wire portion and a lower portion of the pad portion, and at least partially corresponding to an overlapping area of the fan-out wire portion and the pad portion,
wherein the second fan-out wire at least partially overlaps with the first pad in a plan view.

2. The display device of claim 1, wherein the conductive layer is integrally provided to correspond to a portion of the first pad and a portion of the second pad.

3. The display device of claim 1, wherein the conductive layer does not overlap with the first contact hole and the second contact hole.

4. The display device of claim 1, wherein the conductive layer is configured to be applied with a constant voltage.

5. The display device of claim 1, wherein the first pad comprises a first end portion and a second end portion,
wherein the second end portion is between the first end portion and the display area, and
wherein the first contact hole is closer to the second end portion than the first end portion.

6. The display device of claim 1, wherein the conductive layer corresponds entirely to the pad portion, and comprises an opening portion corresponding to the first contact hole and the second contact hole.

7. The display device of claim 1, wherein the first pad and the second pad are arranged in a first direction, and
wherein at least a portion of the second fan-out wire extends in a direction between the first direction and a second direction perpendicular to the first direction.

8. The display device of claim 7, wherein the first pad has a rectangular shape in a plan view, and wherein one side of the rectangular shape is inclined with respect to the first direction.

9. A display device comprising:
a substrate comprising a display area at which an image is displayed by a pixel, and a peripheral area around the display area;
a pad portion at the peripheral area, and comprising a first pad and a second pad adjacent to each other;
a fan-out wire portion comprising a first fan-out wire below the first pad and connected to the first pad through a first contact hole to extend to the display area, and a second fan-out wire below the second pad and connected to the second pad through a second contact hole to extend to the display area; and
a conductive layer between an upper portion of the fan-out wire portion and a lower portion of the Dad portion, and at least partially corresponding to an overlapping area of the fan-out wire portion and the pad portion,
wherein the second fan-out wire at least partially overlaps with the first pad,
wherein the pad portion comprises a first sub-pad portion comprising a plurality of pads extending in a first direction, and a second sub-pad portion comprising a plurality of pads extending in the first direction, and wherein the first sub-pad portion and the second sub-pad portion are arranged along a second direction crossing the first direction.

10. The display device of claim 9, wherein the conductive layer comprises a first sub-conductive layer corresponding to the first sub-pad portion, and a second sub-conductive layer corresponding to the second sub-pad portion, and wherein the first sub-conductive layer and the second sub-conductive layer are spaced apart from each other.

11. The display device of claim 1, wherein a thin film transistor and a storage capacitor are at the display area, the thin film transistor comprising a semiconductor layer, a gate electrode, a source electrode, and a drain electrode, and the storage capacitor comprising a first electrode and a second electrode, wherein the conductive layer is at the same layer as that of the source electrode, and wherein the first fan-out wire is at the same layer as that of the first electrode or the second electrode.

12. The display device of claim 11, wherein the first fan-out wire is at the same layer as that of the first electrode, and wherein the second fan-out wire is at the same layer as that of the second electrode.

13. The display device of claim 11, wherein the thin film transistor overlaps with the storage capacitor.

14. The display device of claim 1, further comprising:
a sealing substrate for sealing the display area; and
a sealing member for bonding the substrate to the sealing substrate at the peripheral area,
wherein the conductive layer and the pad portion at least partially overlap with the sealing member.

15. A display device comprising:
a substrate comprising a display area at which an image is displayed by a pixel, and a peripheral area around the display area;
a pad portion at the peripheral area, and comprising a plurality of pads;
a controller mounted on the pad portion;
a fan-out wire portion comprising a plurality of fan-out wires connected to the plurality of pads to extend to the display area; and
a conductive layer at least partially overlapping with each of the plurality of pads of the pad portion in a plan view, and configured to be applied with a constant voltage.

16. The display device of claim 15, wherein an organic light-emitting diode is at the display area, the organic light emitting diode comprising a pixel electrode, an intermediate layer comprising an organic emission layer, and an opposite electrode, and wherein the conductive layer is configured to be applied with a voltage applied to the opposite electrode.

17. The display device of claim 15, wherein the pad portion and the fan-out wire portion at least partially overlap with each other on different layers from each other, and wherein the conductive layer is between a lower portion of the pad portion and an upper portion of the fan-out wire portion.

18. The display device of claim 15, wherein the conductive layer is integrally provided to correspond to a portion of each of the plurality of pads.

19. The display device of claim 15, wherein the plurality of pads of the pad portion are connected to the plurality of fan-out wires of the fan-out wire portion through a plurality of contact holes, respectively, and wherein the conductive layer does not overlap with the contact holes.

20. The display device of claim 15, wherein the pad portion comprises a first pad and a second pad, wherein the fan-out wire portion comprises a first fan-out wire connected to the first pad, and a second fan-out wire connected to the second pad, and wherein the first pad at least partially overlaps with the second fan-out wire.

* * * * *